(12) United States Patent
Suzuki

(10) Patent No.: US 10,286,806 B2
(45) Date of Patent: May 14, 2019

(54) ELECTRICAL STORAGE SYSTEM

(71) Applicant: TOYOTA JIDOSHA KABUSHIKI KAISHA, Toyota-shi, Aichi-ken (JP)

(72) Inventor: Yusuke Suzuki, Nagakute (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 236 days.

(21) Appl. No.: 15/104,402

(22) PCT Filed: Dec. 17, 2014

(86) PCT No.: PCT/IB2014/002797
§ 371 (c)(1),
(2) Date: Jun. 14, 2016

(87) PCT Pub. No.: WO2015/092521
PCT Pub. Date: Jun. 25, 2015

(65) Prior Publication Data
US 2016/0318417 A1    Nov. 3, 2016

(30) Foreign Application Priority Data

Dec. 20, 2013  (JP) ................................. 2013-264661

(51) Int. Cl.
*H02J 7/00* (2006.01)
*B60L 11/18* (2006.01)
(Continued)

(52) U.S. Cl.
CPC ....... *B60L 11/1862* (2013.01); *B60L 11/1816* (2013.01); *B60L 11/1838* (2013.01);
(Continued)

(58) Field of Classification Search
CPC . H02J 7/0077; B60L 11/1838; B60L 11/1862; B60L 11/1872; H01M 10/486
(Continued)

(56) References Cited

U.S. PATENT DOCUMENTS

2006/0181245 A1* 8/2006 Mizuno .............. G01R 31/3624
                                                          320/132
2010/0318252 A1  12/2010 Izumi
(Continued)

FOREIGN PATENT DOCUMENTS

JP   2007-292666 A   11/2007
JP   2012-132761 A    7/2012
(Continued)

OTHER PUBLICATIONS

Communication dated Oct. 6, 2017 from the United States Patent and Trademark Office in counterpart U.S. Appl. No. 15/100,083.
(Continued)

*Primary Examiner* — Edward Tso
*Assistant Examiner* — Aaron Piggush
(74) *Attorney, Agent, or Firm* — Sughrue Mion, PLLC

(57) ABSTRACT

An electrical storage system includes an electrical storage device, a voltage sensor, a current sensor and a controller. The electrical storage device is configured to be charged with electric power from an external power supply. The controller is configured to detect a first voltage value with the use of the voltage sensor in a state where external charging is temporarily stopped, and calculate a first state of charge corresponding to the first voltage value, when an elapsed time from when external charging at a predetermined electric power is started is longer than or equal to a predetermined time. The predetermined time is a time required until a convergence of a voltage variation resulting from polarization during external charging. The controller is configured to detect a second voltage value with the use of the voltage sensor, when the charging is resumed at the predetermined electric power after the charging is temporarily stopped and then the charging is stopped again, and calculate a second state of charge corresponding to the
(Continued)

second voltage value. The controller is configured to calculate a full charge capacity from an accumulated value of the current value in a period from when the charging is resumed to when the charging is stopped and a variation between the first state of charge and the second state of charge, when a difference between a rate of change corresponding to the first voltage value and a rate of change corresponding to the second voltage value is smaller than or equal to an allowable value. The rate of change is identified from the correlation, and indicates the ratio of a variation in open circuit voltage to a variation in state of charge.

9 Claims, 14 Drawing Sheets

(51) Int. Cl.
*G01R 31/36* (2019.01)
*H01M 10/48* (2006.01)
*H01M 10/42* (2006.01)

(52) U.S. Cl.
CPC ....... *B60L 11/1861* (2013.01); *B60L 11/1872* (2013.01); *G01R 31/361* (2013.01); *H01M 10/48* (2013.01); *H01M 10/486* (2013.01); *H02J 7/0077* (2013.01); *B60L 2240/545* (2013.01); *B60L 2240/547* (2013.01); *B60L 2240/549* (2013.01); *B60L 2240/80* (2013.01); *B60L 2260/44* (2013.01); *G01R 31/3634* (2013.01); *H01M 2010/4271* (2013.01); *H02J 2007/0049* (2013.01); *Y02T 10/7005* (2013.01); *Y02T 10/705* (2013.01); *Y02T 10/7044* (2013.01); *Y02T 10/7072* (2013.01); *Y02T 90/121* (2013.01); *Y02T 90/128* (2013.01); *Y02T 90/14* (2013.01); *Y02T 90/163* (2013.01)

(58) Field of Classification Search
USPC .......................... 320/109, 132, 134, 156, 157
See application file for complete search history.

(56) References Cited

U.S. PATENT DOCUMENTS

| 2014/0225621 | A1 | 8/2014 | Kimura et al. |
| 2015/0134283 | A1* | 5/2015 | Ogura ................ G01R 31/3648 |
| | | | 702/63 |
| 2017/0005488 | A1 | 1/2017 | Suzuki |

FOREIGN PATENT DOCUMENTS

| JP | 2013-101072 A | 5/2013 |
| JP | 2013-108919 A | 6/2013 |
| JP | 2013-214371 A | 10/2013 |
| WO | 2009104305 A1 | 8/2009 |
| WO | 2012140776 A1 | 10/2012 |
| WO | 2013/054414 A1 | 4/2013 |
| WO | 2013/171786 A1 | 11/2013 |

OTHER PUBLICATIONS

English translation of communication dated Jan. 17, 2017, from the Japanese Patent Office in counterpart application No. 2013-264661.
Notice of Allowance dated Apr. 18, 2018 from the U.S. Patent and Trademark Office, which issued during the prosecution of U.S. Appl. No. 15/100,083.
Communication dated Aug. 30, 2018, from the U.S. Patent and Trademark Office in U.S. Appl. No. 15/100,083.

* cited by examiner

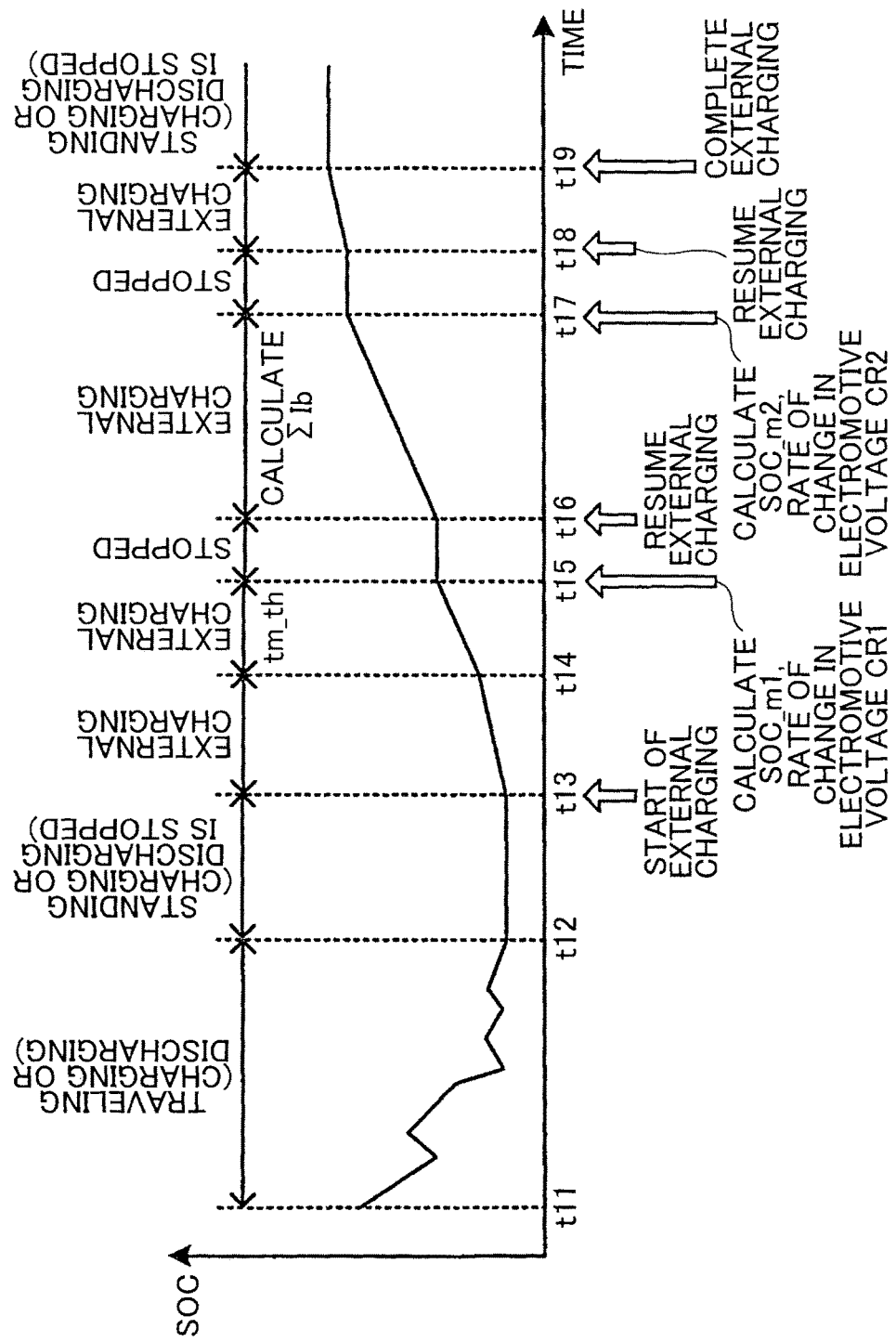

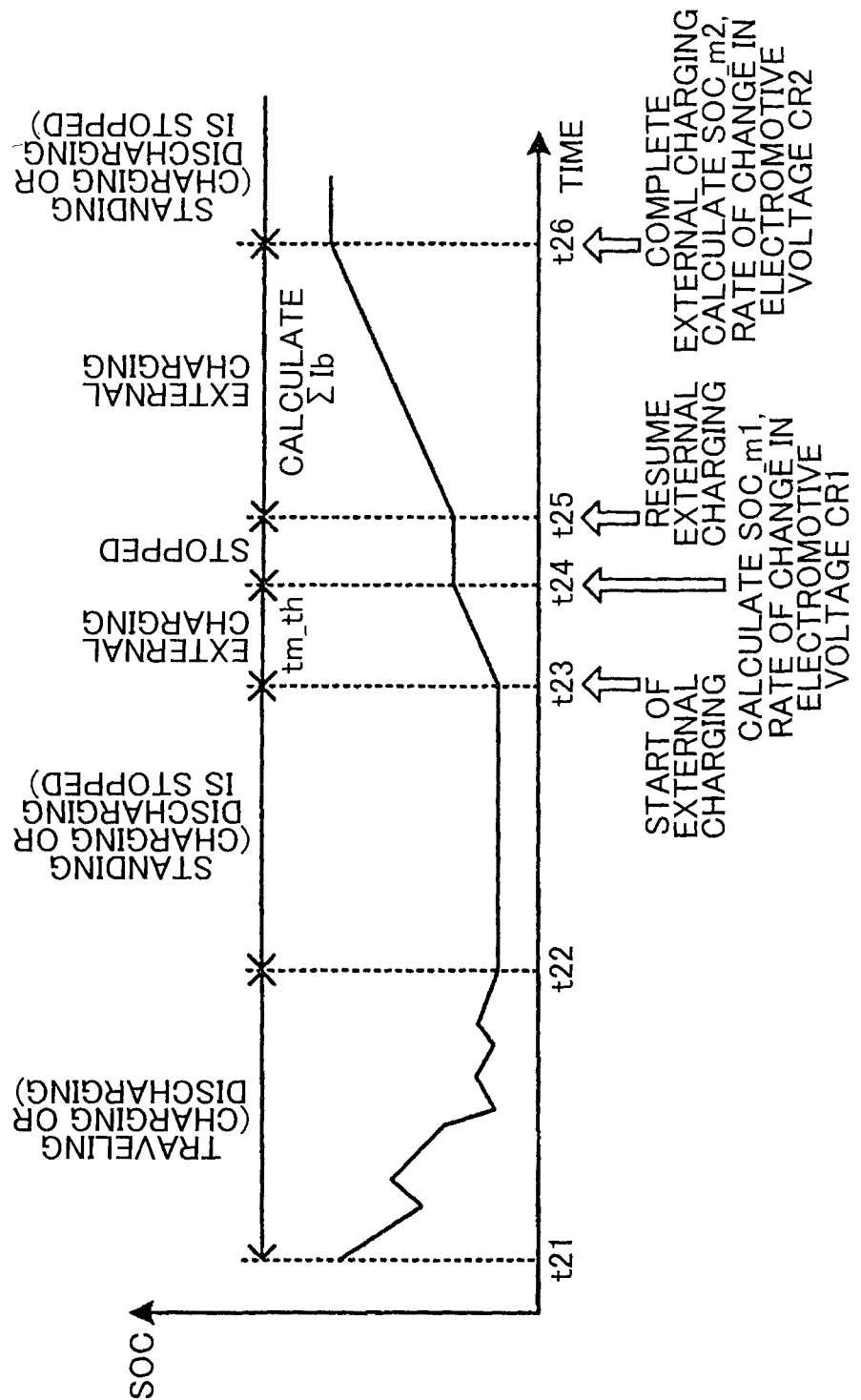

ELECTRICAL STORAGE SYSTEM

BACKGROUND OF THE INVENTION

1. Field of the Invention

The invention relates to an electrical storage system that calculates a full charge capacity of an electrical storage device.

2. Description of Related Art

In Japanese Patent Application Publication No. 2013-101072 (JP 2013-101072 A), when a battery pack is charged with electric power from an external power supply (referred to as external charging), a full charge capacity of the battery pack is calculated (estimated). The full charge capacity of the battery pack is calculated on the basis of a state of charge (SOC) of the battery pack at the start of external charging, an SOC of the battery pack at the completion of external charging, and an accumulated current value in a period during which external charging is being carried out. Because there is a predetermined correlation between an SOC and an open circuit voltage (OCV), the SOC of the battery pack may be calculated from the OCV of the battery pack.

SUMMARY OF THE INVENTION

When polarization occurs as a result of charging or discharging of the battery pack, a voltage value of the battery pack, which is detected by a voltage sensor, (referred to as detected voltage value) includes a voltage variation resulting from the polarization. Therefore, the detected voltage value deviates from the OCV by the amount of the voltage variation resulting from the polarization.

Therefore, if the SOC of the battery pack is calculated (estimated) on the basis of the detected voltage value including the voltage variation resulting from the polarization, the estimation accuracy of the SOC decreases. If the full charge capacity of the battery pack is calculated (estimated) on the basis of the SOC of which the estimation accuracy has decreased, the estimation accuracy of the full charge capacity also decreases.

An aspect of the invention provides an electrical storage system. The electrical storage system includes an electrical storage device, a voltage sensor, a current sensor and a controller. The electrical storage device is configured to be charged with electric power from an external power supply (referred to as external charging). The voltage sensor is configured to detect a voltage value of the electrical storage device. The current sensor is configured to detect a current value of, the electrical storage device. The controller is configured to detect a first voltage value with the use of the voltage sensor in a state where external charging is temporarily stopped, when an elapsed time from when external charging at a predetermined electric power is started is longer than or equal to a predetermined time. The predetermined time is a time required until a convergence of a voltage variation resulting from polarization during external charging. The controller is configured to calculate a first state of charge corresponding to the first voltage value. The first state of charge is calculated by using a correlation between an open circuit voltage of the electrical storage device and a state of charge of the electrical storage device on the assumption that the first voltage value is an open circuit voltage. The controller is configured to detect a second voltage value with the use of the voltage sensor, when the charging is resumed at the predetermined electric power after the charging is temporarily stopped and then the charging is stopped again. The controller is configured to calculate a second state of charge corresponding to the second voltage value. The second state of charge is calculated by using the correlation on the assumption that the second voltage value is an open circuit voltage. The controller is configured to calculate a full charge capacity from an accumulated value of the current value in a period from when the charging is resumed to when the charging is stopped and a variation between the first state of charge and the second state of charge, when a difference between a rate of change corresponding to the first voltage value and a rate of change corresponding to the second voltage value is smaller than or equal to an allowable value. The rate of change is identified from the correlation, and indicates the ratio of a variation in open circuit voltage to a variation in state of charge.

When the first voltage value and the second voltage value are detected, there is polarization, resulting from the external charging at the predetermined electric power. According to the above aspect, even when there is polarization resulting from the external charging at the predetermined electric power and each of the first voltage value and the second voltage value deviates from a corresponding open circuit voltage, it is possible to ensure the calculation accuracy (estimation accuracy) of the full charge capacity. Hereinafter, this will be specifically described.

Initially, an open circuit voltage at the time when the external charging at the predetermined electric power is temporarily stopped (first open circuit voltage corresponding to the first voltage value) and an open circuit voltage at the time when the external charging at the predetermined electric power is resumed and then stopped again (second open circuit voltage corresponding to the second voltage value) are acquired. By acquiring these open circuit voltages, it is possible to ensure the calculation accuracy of the full charge capacity. Specifically, the full charge capacity is calculated on the basis of a variation indicating a difference between the states of charge respectively calculated from the first open circuit voltage and the second open circuit voltage and an accumulated value of the current value in a period from when the external charging is resumed to when the external charging is stopped again. Thus, it is possible to ensure the calculation accuracy of the full charge capacity.

In the above aspect, even when the first voltage value deviates from the first open circuit voltage or the second voltage value deviates from the second open circuit voltage, the variation indicating the difference between the states of charge respectively calculated from the first voltage value and the second voltage value is made substantially equal to the variation indicating a difference between the states of charge respectively calculated from the first open circuit voltage and the second open circuit voltage. The accumulated value of the current value in a period from when the external charging is resumed to when the external charging is stopped again is the same. Thus, the full charge capacity that is calculated from the first voltage value and the second voltage value is substantially equal to the full charge capacity that is calculated from the first open circuit voltage and the second open circuit voltage. Therefore, even when the full charge capacity is calculated from the first voltage value and the second voltage value, it is possible to ensure the calculation accuracy of the full charge capacity.

Substantially equalizing a variation in state of charge will be described below. When it is checked whether the elapsed time is longer than or equal to the predetermined time, it is possible to check whether the voltage variation resulting from polarization during the external charging at the predetermined electric power has converged. At this time, the voltage variation included in the first voltage value (the difference between the first voltage value and the first open circuit voltage) is equal to the voltage variation included in the second voltage value (the difference between the second voltage value and the second open circuit voltage).

In the above aspect, it is checked whether the difference between the rate of change corresponding to the first voltage value and the rate of change corresponding to the second voltage value is smaller than or equal to the allowable value. When the difference is smaller than or equal to the allowable value, a deviation between the first state of charge corresponding to the first voltage value and the state of charge corresponding to the first open circuit voltage is substantially equal to a deviation between the second state of charge corresponding to the second voltage value and the state of charge corresponding to the second open circuit voltage. Because the external charging is carried out, the states of charge (the first state of charge and the second state of charge) corresponding to the voltage values (the first voltage value and the second voltage value) respectively deviate in the same direction from the states of charge corresponding to the open circuit voltages (the first open circuit voltage and the second open circuit voltage).

Thus, the variation indicating the difference between the states of charge that are respectively calculated from the first voltage value and the second voltage value is substantially equal to the variation indicating the difference between the states of charge that are respectively calculated from the first open circuit voltage and the second open circuit voltage. Accordingly, as described above, even in a state where there is polarization resulting from the external charging at the predetermined electric power, it is possible to ensure the calculation accuracy of the full charge capacity.

In the above aspect, the controller may be configured to shorten the predetermined time as the predetermined electric power decreases. The voltage variation is more likely to converge as the predetermined electric power decreases. Therefore, by shortening the predetermined time, the accumulated value of the current value or the variation in state of charge is increased as described above. Thus, it is possible to improve the calculation accuracy of the full charge capacity.

In starting the external charging at the predetermined electric power in a state where charging or discharging of the electrical storage device is stopped, when there is already polarization, a time required until the voltage variation resulting from polarization during the external charging has converged tends to extend. Therefore, it is preferable to acquire the state of polarization at the start of the external charging. By setting the predetermined time in consideration of the state of polarization at the start of the external charging, even when there is already polarization at the start of the external charging, it may be determined whether the voltage variation resulting from polarization during the external charging has converged.

As a time during which charging or discharging of the electrical storage device is stopped (referred to as standing time) extends before the external charging is started, polarization is more likely to be eliminated. In the above aspect, the controller may be configured to shorten the predetermined time as the standing time extends, when the charging at the predetermined electric power is started in a state where charging or discharging of the electrical storage device is stopped.

In the above aspect, the electrical storage system may further include a temperature sensor. The temperature sensor is configured to detect a temperature of the electrical storage device. The controller may be configured to shorten the predetermined time as the temperature of the electrical storage device at the start of the external charging at the predetermined electric power increases. As the temperature of the electrical storage device increases, the voltage variation is more likely to converge. Therefore, by shortening the predetermined time, a time required until the external charging is temporarily stopped may be shortened.

As a time required until the external charging is temporarily stopped shortens, a time from when the external charging is resumed to when the external charging is stopped again may be extended. Accordingly, in a period from when the external charging is resumed to when the external charging is stopped again, the accumulated value of the current value may be increased or the variation in the state of charge of the electrical storage device may be increased.

As the accumulated value of the current value or the variation in state of charge decreases, the calculation accuracy of the full charge capacity tends to decrease. Therefore, by increasing the accumulated value of the current value or the variation in state of charge, it is possible to improve the calculation accuracy of the full charge capacity.

In starting the external charging at the predetermined electric power in a state where charging or discharging of the electrical storage device is stopped, as the temperature of the electrical storage device at the time when charging or discharging is stopped increases, polarization is more likely to be eliminated. In the above aspect, the electrical storage system may further include a temperature sensor. The temperature sensor is configured to detect a temperature of the electrical storage device. The controller may be configured to shorten the predetermined time as the temperature of the electrical storage device increases, when the charging at the predetermined electric power is started from a state where charging or discharging of the electrical storage device is stopped. By shortening the predetermined time in this way, it is possible to suppress an undue extension of a time required until it may be determined whether the voltage variation has converged. By shortening the predetermined time, the accumulated value of the current value or the variation in state of charge is increased as described above. Thus, it is possible to improve the calculation accuracy of the full charge capacity.

In the above aspect, the controller may be configured to temporarily stop the external charging at the time when an offset value of the current sensor is acquired. The controller may be configured to detect the first voltage value in response to the fact that the elapsed time is longer than or equal to the predetermined time. In the above aspect, the controller may be configured to, when the external charging is temporarily stopped in order to acquire an offset value of the current sensor, detect the second voltage value. Thus, in accordance with the timing at which the offset value is acquired, the first voltage value or the second voltage value may be detected.

On the other hand, when the external charging is completed, the second voltage value may be detected. Thus, in comparison with the case where the second voltage value is detected while the external charging is temporarily stopped before the completion of the external charging, the accumulated value of the current value or the variation in state of charge may be increased. Accordingly, it is possible to improve the calculation accuracy of the full charge capacity.

Another aspect of the invention provides an electrical storage system for a vehicle. The electrical storage system includes an electrical storage device and a controller. The electrical storage device is configured to be charged with electric power from an external power supply. The external power supply is installed outside the electrical storage device separately from the electrical storage device. The controller is configured to stop the external charging after a lapse of a predetermined time from when the external charging is started, when the charging is carried out with electric power from the external power supply (external charging). The predetermined time is a time required until a convergence of a change in the voltage of the electrical storage device due to polarization resulting from the external charging. The controller is configured to resume the external charging after the external charging is stopped, and calculate a full charge capacity of the electrical storage device on the basis of a variation in state of charge of the electrical storage device in a period from when the external charging is resumed to when the external charging is completed.

Further another aspect of the invention provides an electrical storage system for a vehicle. The electrical storage system includes an electrical storage device and a controller. The electrical storage device is configured to be charged with electric power from an external power supply (external charging). The external power supply is installed outside the electrical storage device separately from the electrical storage device. The controller is configured to calculate the full charge capacity of the electrical storage device on the basis of the state of charge of the electrical storage device in a period from when the external charging is started to when the external charging is completed. The controller is configured to wait the calculation of the full charge capacity of the electrical storage device until the external charging is started after a convergence of a change in the voltage of the electrical storage device due to polarization resulting from the external charging, when the external charging is carried out

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 5 is a time chart that shows the behavior of the SOC of the battery pack;

FIG. 6 is a time chart that shows the behavior of the SOC of the battery pack;

DETAILED DESCRIPTION OF EMBODIMENTS

Hereinafter, embodiments of the invention will be described.

Figure 1:
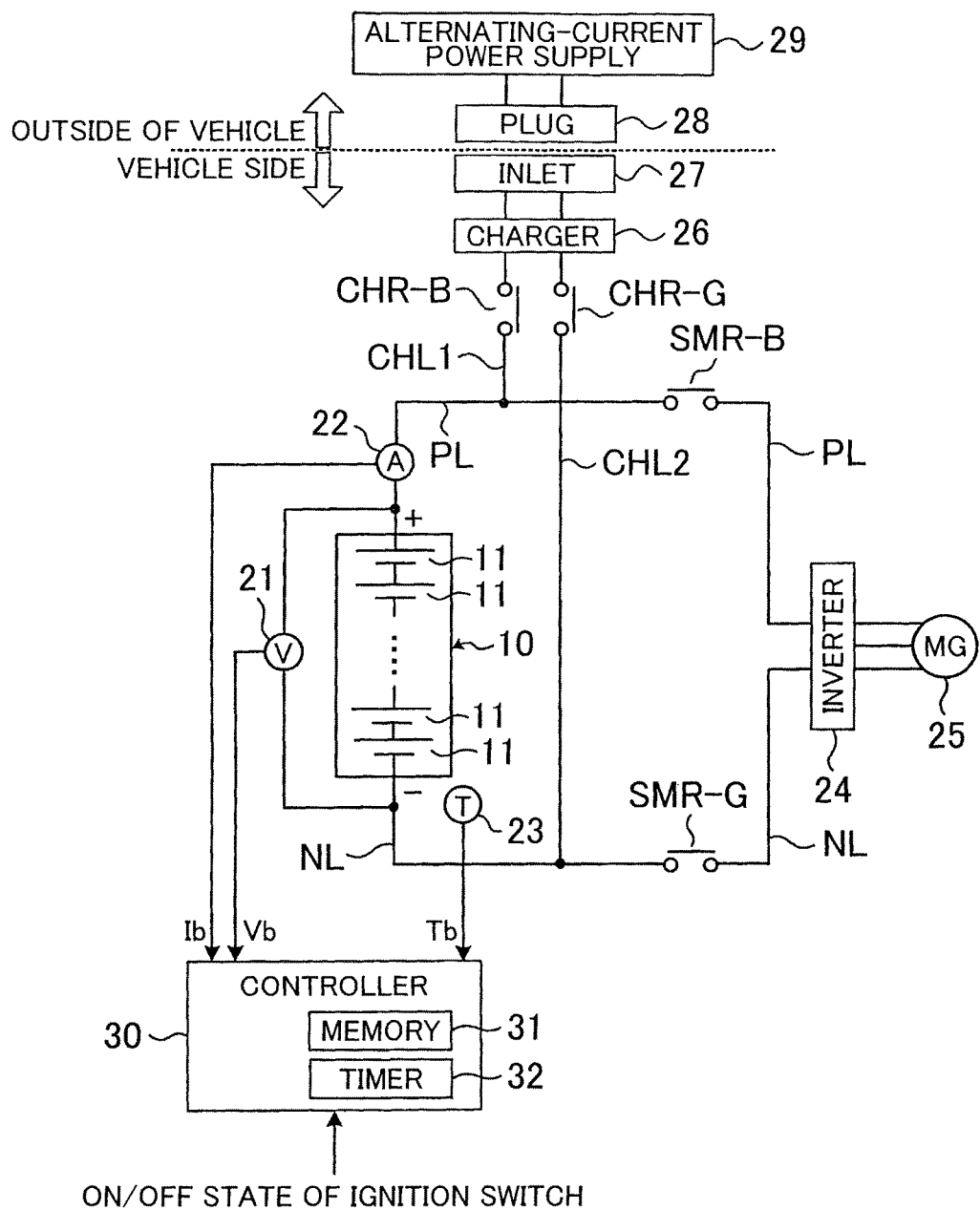
FIG. 1 is a view that shows the configuration of a battery system.

FIG. 1 is a view that shows the configuration of a battery system according to a first embodiment (which corresponds to an electrical storage system according to the invention). The battery system shown in FIG. 1 is mounted on a vehicle. The vehicle is, for example, a plug-in hybrid vehicle (PHV) or an electric vehicle (EV). The PHV includes another power source in addition to a battery pack 10 as a power source for propelling the vehicle. The other power source is an engine or a fuel cell. The EV includes only the battery pack 10 as a power source for propelling the vehicle.

In the present embodiment, the battery pack 10 is mounted on the vehicle; however, the battery pack 10 is not limited to this arrangement. That is, as long as a system that is able to charge the battery pack 10 at a constant current, the invention is applicable.

The battery pack (which corresponds to an electrical storage device according to the invention) 10 includes a plurality of serially connected single cells 11. A secondary battery, such as a nickel-metal hydride battery and a lithium ion battery, may be used as each single cell 11. Instead of the secondary battery, an electric double layer capacitor may be used. The number of the single cells 11 may be set as needed on the basis of a required output, or the like, of the battery pack 10. The battery pack 10 may include a plurality of the single cells 11 that are connected in parallel with each other.

A voltage sensor 21 detects the voltage value Vb of the battery pack 10, and outputs the detected result to a controller 30. A current sensor 22 detects the current value Ib of the battery pack 10, and outputs the detected result to the controller 30. In the present embodiment, the current value Ib at the time when the battery pack 10 is discharged is defined as a positive value. The current value Ib at the time when the battery pack 10 is charged is defined as a negative value. A temperature sensor 23 detects the temperature (battery temperature) Tb of the battery pack 10, and outputs the detected result to the controller 30. As is publicly known, the voltage value Vb, the current value Ib and the battery temperature Tb are used to control charging or discharging of the battery pack 10.

The controller 30 includes a memory 31 and a timer 32. The memory 31 stores various pieces of information, which are used by the controller 30 to execute a predetermined process (particularly, a process described in the present embodiment). The timer 32 is used to measure a time. In the present embodiment, the memory 31 and the timer 32 are incorporated in the controller 30; instead, at least one of the memory 31 or the timer 32 may be provided outside the controller 30. The controller 30 may operate upon reception of electric power from a power supply different from the battery pack 10. The power supply is, for example, an auxiliary battery mounted on the vehicle. The auxiliary battery may be charged with electric power discharged from the battery pack 10.

A positive electrode line PL is connected to the positive electrode terminal of the battery pack 10. A negative electrode line NL is connected to the negative electrode terminal of the battery pack 10. A system main relay SMR-B is provided in the positive electrode line PL. A system main relay SMR-G is provided in the negative electrode line NL. The system main relays SMR-B, SMR-G each switch between an on state and an off state upon reception of a drive signal from the controller 30.

Information about the on/off state of an ignition switch is input to the controller 30. When the ignition switch switches from the off state to the on state, the controller 30 outputs drive signals for switching the system main relays SMR-B, SMR-G into the on state. When the ignition switch switches from the on state to the off state, the controller 30 outputs drive signals for switching the system main relays SMR-B, SMR-G into the off state.

The battery pack 10 is connected to an inverter 24 via the positive electrode line PL and the negative electrode line NL. When the system main relays SMR-B, SMR-G are in the on state, the battery pack 10 is connected to the inverter 24, and the battery system shown in FIG. 1 enters an activated state (ready-on state). When the system main relays SMR-B, SMR-G are in the off state, connection of the battery pack 10 with the inverter 24 is interrupted, and the battery system shown in FIG. 1 enters a stopped state (ready-off state).

The inverter 24 converts direct-current power, output from the battery pack 10, to alternating-current power, and outputs the alternating-current power to a motor generator (MG) 25. The motor generator 25 generates kinetic energy (power) for propelling the vehicle upon reception of the alternating-current power output from the inverter 24. The kinetic energy generated by the motor generator 25 is transmitted to wheels, thus making it, possible to propel the vehicle.

When the vehicle is decelerated or the vehicle is stopped, the motor generator 25 converts kinetic energy, generated during braking of the vehicle, to electric energy (alternating-current power). The inverter 24 converts alternating-current power, generated by the motor generator 25, to direct-current power, and outputs the direct-current power to the battery pack 10. Thus, the battery pack 10 stores regenerative electric power.

In the battery system according to the present embodiment, a step-up circuit may be provided in a current path between the battery pack 10 and the inverter 24. The step-up circuit is able to step up the output voltage of the battery pack 10 and then to output the stepped-up electric power to the inverter 24. The step-up circuit is able to step down the output voltage of the inverter 24 and then to output the stepped-down electric power to the battery pack 10.

A charging line CHL1 is connected to the positive electrode line PL between the positive electrode terminal of the battery pack 10 and the system main relay SMR-B. A charging line CHL2 is connected to the negative electrode line NL between the negative electrode terminal of the battery pack 10 and the system main relay SMR-G. A charger 26 is connected to the charging lines CHL1, CHL2. A charging relay CHR-B is provided in the charging line CHL1 between the charger 26 and the positive electrode line PL. A charging relay CHR-G is provided in the charging line CHL2 between the charger 26 and the negative electrode line NL.

The charging relays CHR-B, CHR-G each switch between an on state and an off state upon reception of a drive signal from the controller 30. An inlet (so-called connector) 27 is connected to the charger 26 via the charging lines CHL1, CHL2. A plug (so-called connector) 28 is connected to the inlet 27. That is, the plug 28 may be connected to the inlet 27, or the plug 28 may be disconnected from the inlet 27.

The plug 28 is connected to an alternating-current power supply (which corresponds to an external power supply according to the invention) 29. For example, a commercial power supply may be used as the alternating-current power supply 29. The plug 28 and the alternating-current power supply 29 are installed separately from the vehicle outside the vehicle. When the plug 28 is connected to the inlet 27 and the charging relays CHR-B, CHR-G are in the on state, it is possible to charge the battery pack 10 with electric power from the alternating-current power supply 29. This charging is termed external charging.

When external charging is carried out, the charger 26 converts alternating-current power from the alternating-current power supply 29 to direct-current power, and outputs the direct-current power to the battery pack 10. The charger 26 is able to step up the output voltage of the alternating-current power supply 29 and then to output the stepped-up electric power to the battery pack 10. The controller 30 controls the operation of the charger 26. In external charging, in a period from the start of external charging to the completion of external charging, charging may be carried out at a constant electric power or may be carried out while changing an electric power.

A system that supports external charging is not limited to the system shown in FIG. 1. Specifically, as long as a system is able to charge the battery pack 10 with electric power from a power supply installed outside the vehicle (external power supply), the invention is applicable.

For example, the charging line CHL1 may be connected to the positive electrode line PL between the system main relay SMR-B and the inverter 24. The charging line CHL2 may be connected to the negative electrode line NL between the system main relay SMR-G and the inverter 24. In this case, when external charging is carried out, not only the charging relays CHR-B, CHR-G but also the system main relays SMR-B, SMR-G need to be switched into the on state.

In the present embodiment, the alternating-current power supply 29 is used. Instead of the alternating-current power supply 29, a direct-current power supply (which corresponds to the external power supply according to the invention) may be used. In this case, the charger 26 may be omitted. Supply of electric power from the external power supply is not limited to supply of electric power with the use of a cable. Instead, a so-called contactless charging system may be used. In the contactless charging system, it is possible to supply electric power by utilizing electromagnetic induction or a resonance phenomenon without any cable. A known configuration may be employed as the contactless charging system as needed.

In the present embodiment, when external charging has been carried out, the full charge capacity of the battery pack 10 is calculated (estimated). The full charge capacity of the battery pack 10 is calculated on the basis of the following mathematical expression (1).

$$FCC = \frac{\Sigma Ib}{SOC\_e - SOC\_s} = \frac{\Sigma Ib}{\Delta SOC} \quad (1)$$

In the above mathematical expression (1), FCC is the full charge capacity of the battery pack 10. SOC_s is the state of charge (SOC) of the battery pack 10 at the time when external charging is started. SOC_e is the SOC of the battery pack 10 at the time when external charging is completed. ΔSOC is a variation in SOC (a difference between the SOC_s and the SOC_e) resulting from external charging. ΣIb is a value obtained by accumulating the current value (charge current) Ib (accumulated current value) in a period from the start of external charging to the completion of external charging. The current value Ib is detected by the current sensor 22. As described above, the current value (charge current) Ib is a negative value, so, when the accumulated current value ΣIb is calculated, the absolute value of the current value (charge current) Ib is used.

The SOC indicates the ratio of a level of charge to the full charge capacity FCC. Because there is a correlation between an SOC and an open circuit voltage (OCV), when the correlation is obtained in advance, it is possible to calculate (estimate) the SOC of the battery pack 10 from the OCV of the battery pack 10. Specifically, by using the voltage value Vb detected by the voltage sensor 21, it is possible to calculate the SOC of the battery pack 10. When the voltage value Vb is detected while charging or discharging of the battery pack 10 is stopped, a voltage variation ΔV_ir resulting from charging or discharging (energization) is not included in the voltage value Vb, and the voltage value Vb approaches the OCV. The voltage variation ΔV_ir resulting from charging or discharging is a value (Ib×R) obtained by multiplying the current value Ib by the internal resistance R of the battery pack 10.

On the other hand, polarization occurs when the battery pack 10 is charged or discharged, with the result that a voltage variation ΔV_dyn resulting from the polarization is included in the voltage value Vb detected by the voltage sensor 21. That is, even when there is no voltage variation ΔV_ir, but when there is polarization, the voltage value Vb deviates from the OCV by the amount of the voltage variation ΔV_dyn. Even when the voltage value Vb deviates from the OCV, it may be possible to ensure the accuracy of the variation ΔSOC, that is, the accuracy of the full charge capacity FCC, by using the voltage value Vb. Hereinafter, this will be specifically described.

The SOCs (SOC_s, SOC_e) are calculated (estimated) from the corresponding OCVs by using the correlation between an OCV and an SOC. Thus, a variation ΔSOC_1 is calculated as a difference between these SOCs. When the voltage value Vb (including the voltage variation ΔV_dyn) is regarded as the OCV, it is possible to calculate (estimate) the SOCs (SOC_s, SOC_e) from the corresponding voltage values Vb by using the correlation between an OCV and an SOC. A variation ΔSOC_2 may be calculated as a difference between these SOCs. At this time, the variations ΔSOC_1, ΔSOC_2 can be equal to each other. Because the voltage value Vb deviates from the OCV by the amount of the voltage variation ΔV_dyn, the SOC that is calculated from the voltage value Vb is different from the SOC that is calculated from the OCV.

Figure 2:
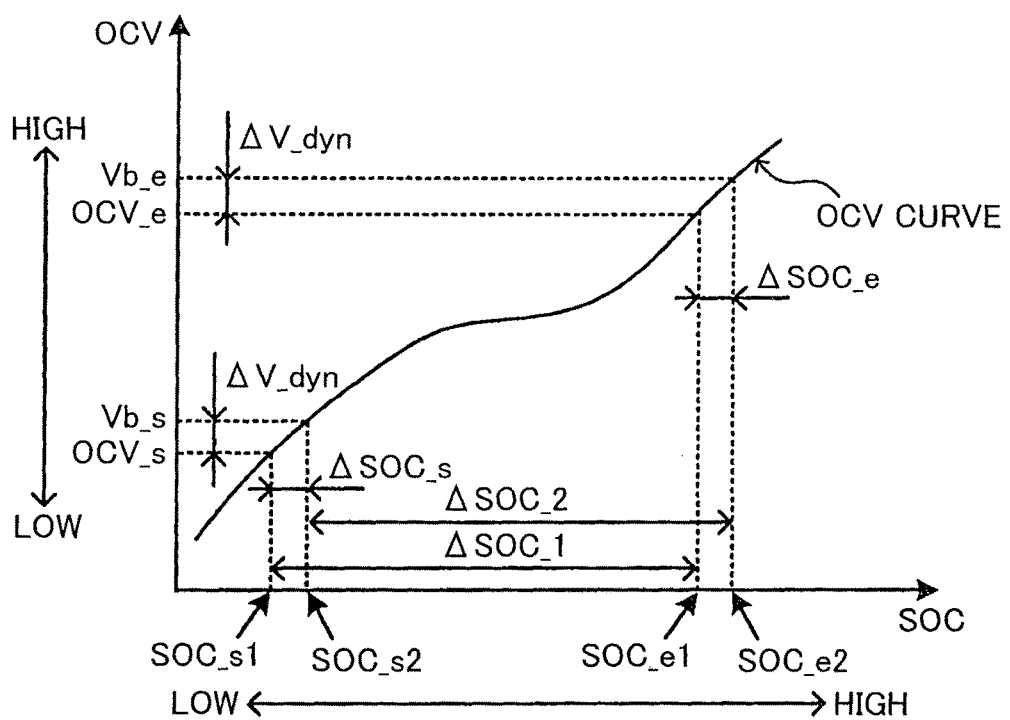
FIG. 2 is a graph that shows the correlation (OCV curve) between an OCV and an SOC.

This point will be described with reference to FIG. 2. FIG. 2 shows the correlation (so-called OCV curve) between an OCV and an SOC. In FIG. 2, the ordinate axis represents OCV, and the abscissa axis represents SOC.

In FIG. 2, OCV_s is the OCV of the battery pack 10 at the time when external charging is started, and OCV_e is the OCV of the battery pack 10 at the time when external charging is completed. Vb_s is the voltage value of the battery pack 10 at the time when external charging is started, and includes the voltage variation ΔV_dyn. That is, the voltage value Vb_s is higher than the OCV_s, and the difference between the voltage value Vb_s and the OCV_s is the voltage variation ΔV_dyn. Vb_e is the voltage value of the battery pack 10 at the time when external charging is completed, and includes the voltage-variation ΔV_dyn. That is, the voltage value Vb_e is higher than the OCV_e, and the difference between the voltage value Vb_e and the OCV_e is the voltage variation ΔV_dyn.

SOC_s1 is the SOC corresponding to the OCVs in the OCV curve shown in FIG. 2. SOC_s2 is the SOC corresponding to the voltage value Vb_s and is higher than the SOC_s1 in the OCV curve shown in FIG. 2. ΔSOC_s is the difference between the SOC_s1 and the SOC_s2. SOC_e1 is the SOC corresponding to the OCV_e in the OCV curve shown in FIG. 2. SOC_e2 is the SOC corresponding to the voltage value Vb_e and is higher than the SOC_e1 in the OCV curve shown in FIG. 2. ΔSOC_e is the difference between the SOC_e1 and the SOC_e2.

When the voltage variation ΔV_dyn included in the voltage value Vb_s is equal to the voltage variation ΔV_dyn included in the voltage value Vb_e and the gradients of the OCV curve, respectively corresponding to these voltage variations ΔV_dyn, are equal to each other, the difference ΔSOC_s is equal to the difference ΔSOC_e. When the full charge capacity FCC is calculated on the basis of the OCV_s and the OCV_e, a variation ΔSOC_1 corresponding to the difference between the SOC_s1 and the SOC_e1 is calculated. When the full charge capacity FCC is calculated on the basis of the voltage values Vb_s, Vb_e, a variation ΔSOC_2 corresponding to the difference between the SOC_s2 and the SOC_e2 is calculated.

As described above, when the difference ΔSOC_s is equal to the difference ΔSOC_e, the variation ΔSOC_1 is equal to the variation ΔSOC_2. Between the variations ΔSOC_1, ΔSOC_2, the accumulated current value ΣIb is the same. Thus, the full charge capacity FCC that is calculated from the voltage values Vb_s, Vb_e is equal to the full charge capacity FCC that is calculated from the OCV_s and the OCV_e. That is, even when the full charge capacity FCC is calculated (estimated) on the basis of the voltage values Vb_s, Vb_e including the voltage variation ΔV_dyn, it is possible to ensure the estimation accuracy of the full charge capacity FCC.

Figure 3:
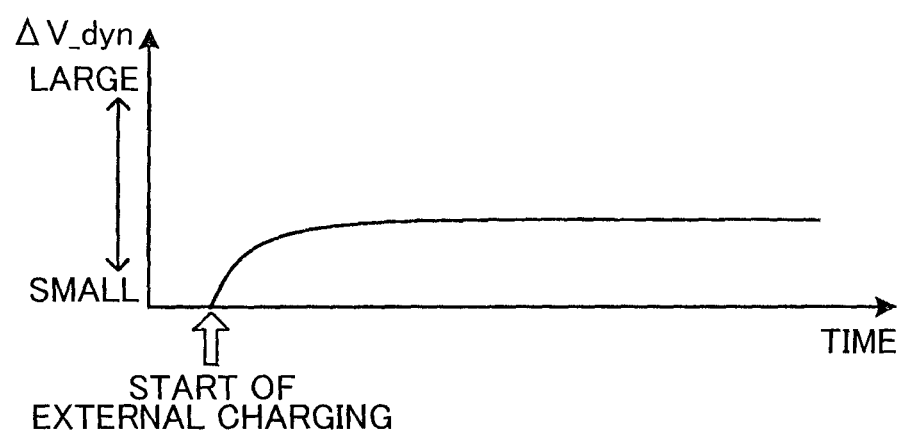
FIG. 3 is a graph that illustrates a state where a voltage variation resulting from polarization during external charging converges.

In the present embodiment, in consideration of the above-described point, the full charge capacity FCC of the battery pack 10 is calculated (estimated). While external charging is being carried out at a predetermined electric power, the voltage variation ΔV_dyn may be made constant with the progress of external charging. Specifically, the voltage variation ΔV_dyn resulting from external charging changes as shown in FIG. 3. In FIG. 3, the, ordinate axis represents voltage variation ΔV_dyn, and the abscissa axis represents time.

As shown in FIG. 3, when external charging is started at the predetermined electric power, polarization occurs as a result of external charging, and the voltage variation ΔV_dyn increases. With a lapse of time, the voltage variation ΔV_dyn becomes more difficult to change. That is, the voltage variation ΔV_dyn converges to a value according to a charging state of external charging. The charging state is the battery temperature Tb or the charge power at the time when external charging is being carried out. The converged voltage variation ΔV_dyn depends on the battery temperature Tb or the charge power.

For example, as the battery temperature Tb decreases, the converged voltage variation ΔV_dyn tends to increase. As the battery temperature Tb decreases, a time required until a convergence of the voltage variation ΔV_dyn tends to extend. On the other hand, as the charge power increases, the converged voltage variation $\Delta V\_dyn$ tends to increase. As the charge power increases, a time required until a convergence of the voltage variation $\Delta V\_dyn$ tends to extend.

In a state where the voltage variation $\Delta V\_dyn$ has converged, the voltage variation $\Delta V\_dyn$ included in the voltage value Vb is constant (converged value) even when the voltage value Vb is detected at any timing. In the present embodiment, when external charging is carried out at a predetermined electric power Win_fix, external charging is temporarily stopped after the voltage variation $\Delta V\_dyn$ resulting from external charging has converged, and then a voltage value (referred to as first stop voltage value) Vb_m1 is detected. When external charging is resumed and then external charging is stopped again, a voltage value (referred to as second stop voltage value) Vb_m2 is detected. The first stop voltage value Vb_m1 corresponds to a first voltage value according to the invention. The second stop voltage value Vb_m2 corresponds to a second voltage value according to the invention.

When external charging is temporarily stopped and then external charging is resumed, the voltage variation $\Delta V\_dyn$ resulting from external charging is more likely to converge. Therefore, the first stop voltage value Vb_m1 and the second stop voltage value Vb_m2 are voltage values Vb that are detected in a state where the voltage variation $\Delta V\_dyn$ has converged. While external charging is being carried out at the predetermined electric power Win_fix, the voltage variation $\Delta V\_dyn$ does not change. Thus, the voltage variation $\Delta V\_dyn$ included in the first stop voltage value Vb_m1 is equal to the voltage variation $\Delta V\_dyn$ included in the second stop voltage value Vb_m2. In this case, as in the case described with reference to FIG. 2, even when the full charge capacity FCC is calculated (estimated) from the first stop voltage value Vb_m1 and the second stop voltage value Vb_m2, it may be possible to ensure the estimation accuracy of the full charge capacity FCC.

When the full charge capacity FCC is calculated from the first stop voltage value Vb_m1 and the second stop voltage value Vb_m2, the SOC corresponding to the first stop voltage value Vb_m1 (referred to as SOC_m1) is calculated on the basis of the OCV curve on the assumption that the first stop voltage value Vb_m1 is the OCV. The SOC corresponding to the second stop voltage value Vb_m2 (referred to as SOC_m2) is calculated on the basis of the OCV curve on the assumption that the second stop voltage value Vb_m2 is the OCV. The full charge capacity FCC of the battery pack 10 may be calculated on the basis of the SOC_m1, the SOC_m2 and the accumulated current value $\Sigma Ib$ in a period during which the voltage value Vb changes from the first stop voltage value Vb_m1 to the second stop voltage value Vb_m2.

The full charge capacity FCC is calculated on the basis of the above-described mathematical expression (1); however, the SOC_m1 is used instead of the SOC_s shown in the mathematical expression (1). The SOC_m2 is used instead of the SOC_e shown in the mathematical expression (1). In the mathematical expression (1), the accumulated current value $\Sigma Ib$ in a period from the start of external charging to the completion of external charging is used. When the full charge capacity FCC is calculated from the first stop voltage value Vb_m1 and the second stop voltage value Vb_m2, the accumulated current value $\Sigma Ib$ in a period until the voltage value Vb reaches from the first stop voltage value Vb_m1 to the second stop voltage value Vb_m2 is used. That is, the accumulated current value $\Sigma Ib$ in a period until the SOC of the battery pack 10 changes from the SOC_m1 to the SOC_m2 is used.

Figure 4A:
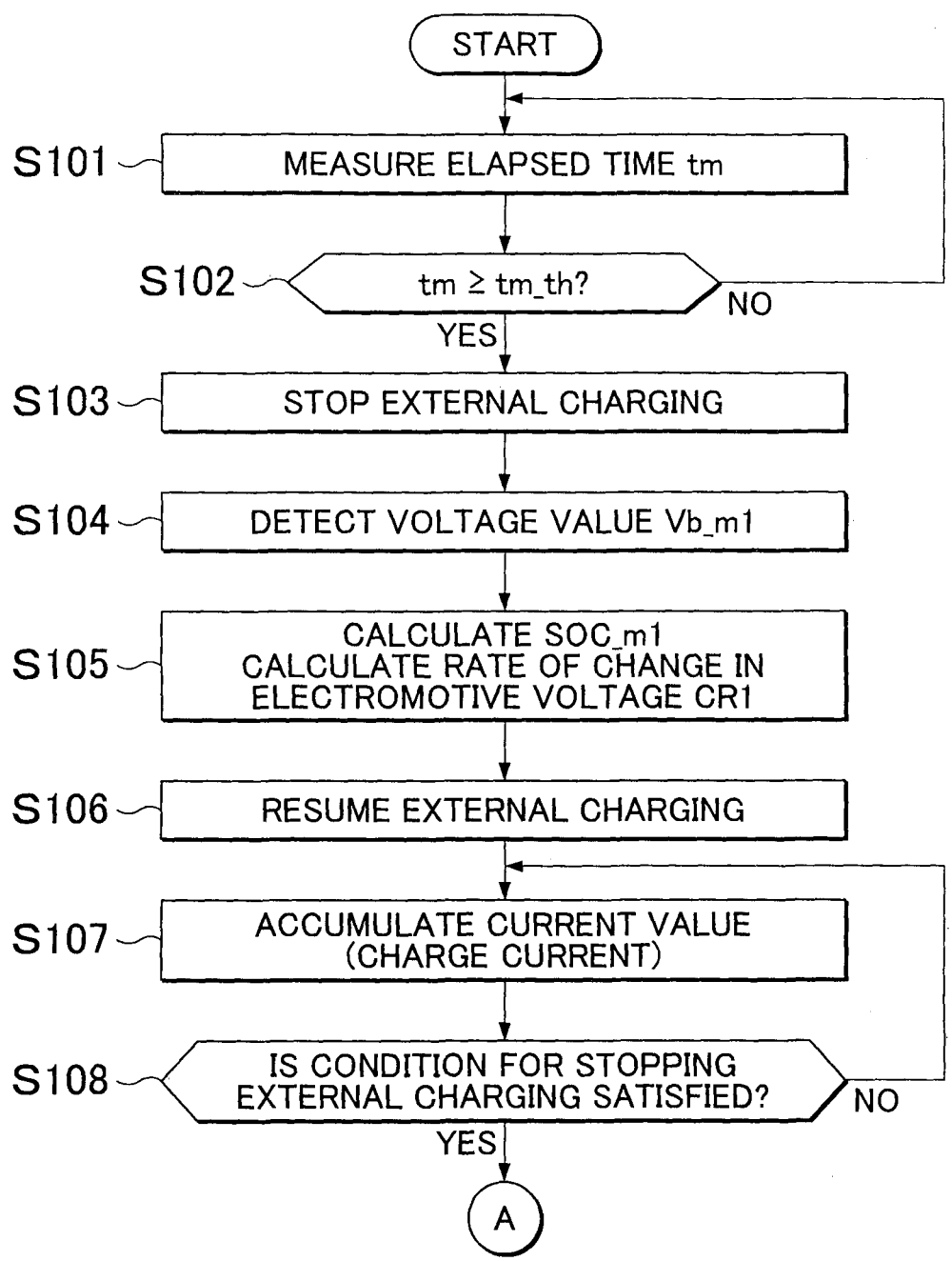
FIG. 4 is a flowchart that illustrates the process of calculating a full charge capacity of a battery pack according to a first embodiment.
Figure 4B:
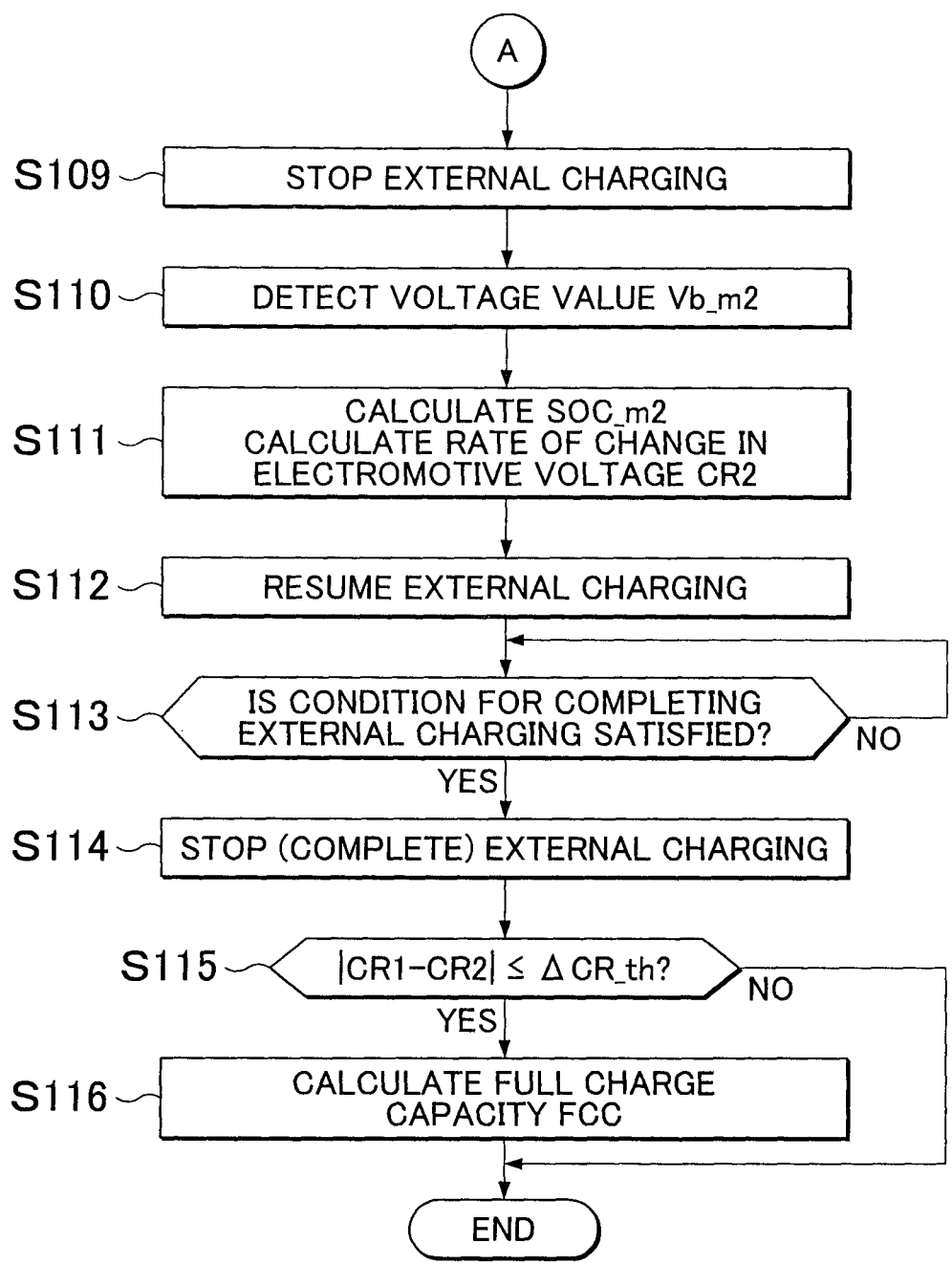

Next, the process of calculating the full charge capacity FCC will be described with reference to the flowchart shown in FIG. 4. The process shown in FIG. 4 is executed by the controller 30. When the plug 28 is connected to the inlet 27 and external charging at the predetermined electric power Win_fix is started, the process shown in FIG. 4 is started.

When external charging is carried out, charging may be carried out at a constant electric power (predetermined electric power Win_fix) in a period from the start of external charging to the completion of external charging. In this case, the process shown in FIG. 4 is started in response to the start of external charging. On the other hand, charge power can be changed in a period from the start of external charging to the completion of external charging. Specifically, electric power that is supplied from the charger 26 to the battery pack 10 can be changed by controlling the operation of the charger 26. When electric power output from the charger 26 is also supplied to a device other than the battery pack, 10, electric power that is supplied to the battery pack 10 can change as a result of a change in electric power that is supplied to the device.

When electric power changes during external charging, external charging can be started at an electric power different from the predetermined electric power Win_fix, and the electric power can be changed to the predetermined electric power Win_fix in the middle of external charging. The timing at which electric power is changed to the predetermined electric power Win_fix may be determined in advance. In this case, the process shown in FIG. 4 is started from when electric power during external charging has changed to the predetermined electric power Win_fix. The predetermined electric power Win_fix may be an electric power at the time when charging is carried out during a longest period within the period from the start of external charging to the completion of external charging. The predetermined electric power Win_fix corresponds to a predetermined electric power according to the invention.

In step S101, the controller 30 measures an elapsed time tm with the use of the timer 32. The elapsed time tm is an elapsed time from when external charging at the predetermined electric power Win_fix is started. When external charging at the predetermined electric power Win_fix is started, measurement of the elapsed time tm is started.

In step S102, the controller 30 determines whether the elapsed time tm measured in the process of step S101 is longer than or equal to a predetermined time tm_th. In the process of step S102, by comparing the elapsed time tm with the predetermined time tm_th, it is determined whether the voltage variation $\Delta V\_dyn$ resulting from polarization during external charging has converged.

The predetermined time tm_th is a time (fixed value) required until a convergence of the voltage variation $\Delta V\_dyn$ resulting from polarization during external charging. The predetermined time tm_th may be set in advance by an experiment, or the like. As described above, a time required until a convergence of the voltage variation $\Delta V\_dyn$ can depend on the battery temperature Tb or the charge power. Therefore, it is possible to set the predetermined time tm_th in consideration of the longest time for a time required until a convergence of the voltage variation $\Delta V\_dyn$. Thus, irrespective of the battery temperature Tb or the charge power, it is possible to determine whether the voltage variation ΔV_dyn has converged. Information that identifies the predetermined time tm_th may be stored in the memory 31.

When the elapsed time tm is shorter than the predetermined time tm_th, measurement of the elapsed time tm is continued in the process of step S101. When the elapsed time tm is longer than or equal to the predetermined time tm_th, the controller 30 stops external charging in step S103. Specifically, the controller 30 stops supply of electric power from the charger 26 to the battery pack 10 by controlling the operation of the charger 26. The charging relays CHR-B, CHR-G may be switched from the on state to the off state.

In step S104, the controller 30 detects the voltage value Vb (first stop voltage value Vb_m1) of the battery pack 10 on the basis of the output of the voltage sensor 21. Because the first stop voltage value Vb_m1 is detected just after external charging is stopped, the first stop voltage value Vb_m1 includes the voltage variation ΔV_dyn resulting from polarization during external charging. That is, the difference between the first stop voltage value Vb_m1 and the OCV corresponding to the first stop voltage value Vb_m1 (referred to as OCV_m1) is the voltage variation ΔV_dyn. Because it is determined in the process of step S102 that the voltage variation ΔV_dyn has converged, the voltage variation ΔV_dyn included in the first stop voltage value Vb_m1 is a converged value.

In step S105, the controller 30 calculates the SOC (SOC_m1 that corresponds to a first SOC according to the invention) of the battery pack 10 on the basis of the first stop voltage value Vb_m1 detected in the process of step S104. Specifically, the controller 30 calculates the SOC_m1 corresponding to the first stop voltage value Vb_m1 by using the correlation (OCV curve shown in FIG. 2) between an OCV and an SOC on the assumption that the first stop voltage value Vb_m1 is regarded as the OCV.

The controller 30 calculates a rate of change in electromotive voltage CR1 in step S105. The rate of change in electromotive voltage CR1 is the ratio of a variation in OCV to a variation in SOC, and is a value obtained by dividing a variation in OCV by a variation in SOC. The rate of change in electromotive voltage CR1 is identified (calculated) from the OCV curve shown in FIG. 2, and is the rate of change in electromotive voltage corresponding to the first stop voltage value Vb_m1. Specifically, within the OCV curve, the gradient of a predetermined region including the first stop voltage value Vb_m1 (or the SOC_m1) is the rate of change in electromotive voltage CR1.

The predetermined region at the time when the gradient of the OCV curve is calculated may be set as needed. The predetermined region is preferably set such that the first stop voltage value Vb_m1 and the OCV_m1 are included in the predetermined region. When, external charging is carried out, the OCV_m1 becomes lower than the first stop voltage value Vb_m1. Therefore, a region lower than or equal to the first stop voltage value Vb_m1 may be set as the predetermined region. On the other hand, the gradient of a tangent to the OCV curve passing through the first stop voltage value Vb_m1 (or the SOC_m1) may be set as the rate of change in electromotive voltage CR1.

In step S106, the controller 30 resumes external charging at the predetermined electric power Win_fix. Specifically, the controller 30 starts supply of electric power from the charger 26 to the battery pack 10 by controlling the operation of the charger 26. When the charging relays CHR-B, CHR-G are in the off state, the controller 30 switches the charging relays CHR-B, CHR-G into the on state. In step S107, the controller 30 detects the current value (charge current) Ib of the battery pack 10 on the basis of the output of the current sensor 22. The controller 30 calculates the accumulated current value ΣIb by accumulating the current value Ib each time the current value (charge current) Ib is detected.

In step S108, the controller 30 determines whether a condition for stopping external charging is satisfied. In the process of step S108, external charging is stopped before external charging is completed. For example, when the voltage value Vb of the battery pack 10, detected by the voltage sensor 21, has reached a target voltage value Vb_tag at which external charging is stopped, the controller 30 may determine that the condition for stopping external charging is satisfied. The target voltage value Vb_tag may be set as needed. The target voltage value Vb_tag is a voltage value Vb lower than the voltage value Vb at the time when external charging is completed. On the other hand, when the amount of electric power (in [Wh]) in a period during which external charging is being carried out has reached a target amount, the controller 30 may determine that the condition for stopping external charging is satisfied. The target amount may be set as needed. The target amount is the amount of electric power that is smaller than the amount of electric power in a period from the start of external charging to the completion of external charging.

Until the condition for stopping external charging is satisfied, the accumulated current value ΣIb is calculated through the process of step S107. Thus, the accumulated current value ΣIb that is calculated in the process of step S107 is the accumulated current value ΣIb in a period from when external charging is resumed in the process of step S106 to when external charging is stopped through the process of step S109 (described later). When it is determined that the condition for stopping external charging is, satisfied, the controller 30 stops external charging in step S109. Specifically, the controller 30 stops the operation of the charger 26. The charging relays CHR-B, CHR-G may be switched from the on state to the off state.

In step S110, the controller 30 detects the voltage value Vb (second stop voltage value Vb_m2) of the battery pack 10 on the basis of the output of the voltage sensor 21. Because the second stop voltage value Vb_m2 is detected just after external charging is stopped, the second stop voltage value Vb_m2 includes the voltage variation ΔV_dyn resulting from polarization during external charging. That is, the difference between the second stop voltage value Vb_m2 and the OCV corresponding to the second stop voltage value Vb_m2 (referred to as OCV_m2) is the voltage variation ΔV_dyn. In a period from when external charging is resumed to when external charging is stopped again, the voltage variation ΔV_dyn is more likely to converge. Therefore, the voltage variation ΔV_dyn included in the second stop voltage value Vb_m2 becomes equal to the voltage variation ΔV_dyn included in the first stop voltage value Vb_m1.

In step S111, the controller 30 calculates the SOC (SOC_m2 that corresponds to a second SOC according to the invention) of the battery pack 10 on the basis of the second stop voltage value Vb_m2 detected in the process of step S110. Specifically, the controller 30 calculates the SOC_m2 corresponding to the second stop voltage value Vb_m2 by using the correlation (OCV curve shown in FIG. 2) between an OCV and an SOC on the assumption that the second stop voltage value Vb_m2 is the OCV.

The controller 30 calculates the rate of change in electromotive voltage CR2 in step S111. The rate of change in electromotive voltage CR2, as well as the rate of change in electromotive voltage CR1, is the ratio of a variation in OCV to a variation in SOC, and is a value obtained by dividing a variation in OCV by a variation in SOC. The rate of change in electromotive voltage CR2 is identified (calculated) from the OCV curve shown in FIG. 2, and is the rate of change in electromotive voltage corresponding to the second stop voltage value Vb_m2. Specifically, within the OCV curve, the gradient of a predetermined region including the second stop voltage value Vb_m2 (or the SOC_m2) is the rate of change in electromotive voltage CR2.

The predetermined region at the time when the gradient of the OCV curve is calculated may be set as needed. The predetermined region is preferably set such that the second stop voltage value Vb_m2 and the OCV_m2 are included in the predetermined region. When external charging is carried out, the OCV_m2 becomes lower than the second stop voltage value Vb_m2. Therefore, a region lower than or equal to the second stop voltage value Vb_m2 may be set as the predetermined region. On the other hand, the gradient of a tangent to the OCV curve passing through the second stop voltage value Vb_m2 (or the SOC_m2) may be set as the rate of change in electromotive voltage CR2.

In step S112, the controller 30 resumes external charging. An electric power at the time when external charging is resumed may be different from the predetermined electric power Win_fix. For example, an electric power at the time when external charging is resumed may be lower than the predetermined electric power Win_fix. Thus, it is possible to carry out external charging while suppressing the amount of increase in voltage value Vb per unit time. Accordingly, it is possible to suppress an overshoot of the voltage value Vb of the battery pack 10 with respect to the voltage value Vb at the completion of external charging. When external charging is resumed, the controller 30 starts supply of electric power from the charger 26 to the battery pack 10 by controlling the operation of the charger 26. When the charging relays CHR-B, CHR-G are in the off state, the controller 30 switches the charging relays CHR-B, CHR-G into the on state.

In step S113, the controller 30 determines whether the condition for completing external charging is satisfied. For example, when the voltage value Vb is higher than or equal to the voltage value Vb at the completion of external charging, the controller 30 may determine that the condition for completing external charging is satisfied. On the other hand, the amount of electric power (in [Wh]) is accumulated from the start of external charging, and, when the accumulated amount of electric power is larger than or equal to the amount of electric power at the completion of external charging, the controller 30 may determine that the condition for completing external charging is satisfied.

Until the condition for completing external charging is satisfied, external charging is continued. When it is determined that the condition for completing external charging is satisfied, the controller 30 stops (completes) external charging in step S114. Specifically, the controller 30 stops the operation of the charger 26, and switches the charging relays CHR-B; CHR-G from the on state to the off state.

In step S115, the controller 30 calculates a difference (absolute value) $\Delta$CR between the rate of change in electromotive voltage CR1 calculated in the process of step S105 and the rate of change in electromotive voltage CR2 calculated in the process of step S111. The controller 30 determines whether the calculated difference $\Delta$CR is smaller than or equal to an allowable value $\Delta$CR_th. The allowable value $\Delta$CR_th is a value for determining whether the rates of change in electromotive voltage CR1, CR2 are substantially equal to each other, and is a value that defines a range in which a deviation between the rates of change in electromotive voltage CR1, CR2 is allowed.

As the difference $\Delta$CR between the rates of change in electromotive voltage CR1, CR2 increases, a difference in SOC, corresponding to the difference between the first stop voltage value Vb_m1 and the OCV_m1, and a difference in SOC, corresponding to the difference between the second stop voltage value Vb_m2 and the OCV_m2, tend to be different from each other. As described with reference to FIG. 2, when the difference $\Delta$SOC_s is equal to the difference $\Delta$SOC_e, it is possible to ensure the estimation accuracy of the full charge capacity FCC.

When the difference $\Delta$CR increases and the differences in SOC are different from each other, it becomes difficult to ensure the estimation accuracy of the full charge capacity FCC. In consideration of this point, it is possible to set the allowable value $\Delta$CR_th. The allowable value $\Delta$CR_th is a value larger than or equal to 0, and may be set as needed. Information that identifies the allowable value $\Delta$CR_th may be stored in the memory 31.

When the difference $\Delta$CR between the rates of change in electromotive voltage CR1, CR2 is larger than the allowable value $\Delta$CR_th, the controller 30 ends the process shown in FIG. 4. In this case, the full charge capacity FCC is not calculated. On the other hand, when the difference $\Delta$CR between the rates of change in electromotive voltage CR1, CR2 is smaller than or equal to the allowable value $\Delta$CR_th, the controller 30 calculates the full charge capacity FCC of the battery pack 10 in step S116.

Specifically, the controller 30 calculates the full charge capacity FCC on the basis of the SOC_m1 calculated in the process of step S105, the SOC m2 calculated in the process of step S111 and the accumulated current value $\Sigma$Ib calculated in the process of step S107. The above-described mathematical expression (1) is used to calculate the full charge capacity FCC. The SOC_m1 is used instead of the SOC_s shown in the mathematical expression (1), and the SOC_m2 is used instead of the SOC_e shown in the mathematical expression (1). The accumulated current value $\Sigma$Ib calculated in the process of step S107 is used as the accumulated current value $\Sigma$Ib shown in the mathematical expression (1).

In the present embodiment (the process shown in FIG. 4), before external charging is resumed through the process of step S106, the SOC_m1 and the rate of change in electromotive voltage CR1 are calculated; however, the timing of calculating the SOC_m1 and the rate of change in electromotive voltage CR1 is not limited to this configuration. In addition, before external charging is resumed through the process of step S112, the SOC_m2 and the rate of change in electromotive voltage CR2 are calculated; however, the timing of calculating the SOC_m2 and the rate of change in electromotive voltage CR2 is not limited to this configuration. Specifically, after external charging is stopped (completed) through the process of step S114, the SOC_m1 and the rate of change in electromotive voltage CR1 may be calculated or the SOC_m2 and the rate of change in electromotive voltage CR2 may be calculated. That is, before external charging is resumed in the process of step S106 or step S112, the first stop voltage value Vb_m1 or the second stop voltage value Vb_m2 just needs to be detected.

In the present embodiment, when the difference $\Delta$CR between the rates of change in electromotive voltage CR1, CR2 is smaller than or equal to the allowable value $\Delta$CR_th, the difference $\Delta$SOC_m1 in SOC, corresponding to the difference between the first stop, voltage value Vb_m1 and the OCV_m1, is regarded as being equal to the difference $\Delta$SOC_m2 in SOC, corresponding to the difference between the second stop voltage value Vb___m2 and the OCV_m2. The first stop voltage value Vb_m1 and the OCV_m1 respectively correspond to the voltage value Vb_s and the OCV_s shown in FIG. 2, and the difference $\Delta$SOC_m1 corresponds to the difference $\Delta$SOC_s shown in FIG. 2. The second stop voltage value Vb_m2 and the OCV_m2 respectively correspond to the voltage value Vb_e and the OCV_e shown in FIG. 2, and the difference $\Delta$SOC_m2 corresponds to the difference $\Delta$SOC_e shown in FIG. 2.

When the difference $\Delta$SOC_m1 is equal to the difference $\Delta$SOC_m2, the full charge capacity FCC, that is calculated from the SOC_m1 and the SOC_m2 becomes equal to the full charge capacity FCC that is calculated from the SOC corresponding to the OCV_m1 and the SOC corresponding to the OCV_m2, as in the case described with reference to FIG. 2. Thus, even when the full charge capacity FCC is calculated (estimated) from the SOC_m1 corresponding to the first stop voltage value Vb_m1 and the SOC_m2 corresponding to the second stop voltage value Vb_m2, it is possible to ensure the estimation accuracy of the full charge capacity FCC.

In this way, according to the present embodiment, even when polarization resulting from external charging remains, it is possible to ensure the estimation accuracy of the full charge capacity FCC. In other words, even when the polarization is not eliminated, it is possible to ensure the estimation accuracy of the full charge capacity FCC.

In the process shown in FIG. 4, the second stop voltage value Vb_m2 is detected while external charging is stopped before external charging is completed; however, the timing of detecting the second stop voltage value Vb_m2 is not limited to this configuration. Specifically, when external charging is completed, the second stop voltage value Vb_m2 may be detected. In this case, in the process of step S108, the process of determining whether the condition for completing external charging is satisfied (the process of step S113) just needs to be executed. Accordingly, the processes of step S112 to step S114 shown in FIG. 4 are omitted.

When the second stop voltage value Vb_m2 is detected at the time when external charging is completed, it is possible to increase the accumulated current value $\Sigma$Ib in comparison with the case where the process shown in FIG. 4 is executed. In addition, it is possible to increase the variation $\Delta$SOC between the SOC_m1 and the SOC_m2.

As the accumulated current value, $\Sigma$Ib decreases, the accumulated current value $\Sigma$Ib becomes more easy to be influenced by a detection error of the current sensor 22. In other words, as the accumulated current value $\Sigma$Ib increases, the accumulated current value $\Sigma$Ib becomes more difficult to be influenced by a detection error of the current sensor 22. On the other hand, as the variation $\Delta$SOC decreases, the variation $\Delta$SOC becomes more easy to be influenced by an estimation error of each of the SOC_m1 and the SOC_m2. In other words, as the variation $\Delta$SOC increases, the variation $\Delta$SOC becomes more difficult to be influenced by an estimation error of each of the SOC_m1 and the SOC_m2.

Because the accumulated current value $\Sigma$Ib and the variation $\Delta$SOC are used to calculate the full charge capacity FCC, it is preferable to increase the accumulated current value $\Sigma$Ib or the variation $\Delta$SOC in terms of improving the estimation accuracy of the full charge capacity FCC. When the second stop voltage value Vb_m2 is detected at the completion of external charging, the accumulated current value $\Sigma$Ib or the variation $\Delta$SOC may be increased, so it is possible to improve the estimation accuracy of the full charge capacity FCC.

FIG. 5 shows the behavior (one example) of the SOC of the battery pack 10. In FIG. 5, the ordinate axis represents the SOC of the battery pack 10, and the abscissa axis represents time. Between time t11 and time t12, the vehicle travels, and the battery pack 10 is charged or discharged in response to the traveling state of the vehicle. The ignition switch is switched from the on state to the off state at time t12. Between time t12 and time t13, the vehicle is left standing, and charging or discharging of the battery pack 10 is stopped. By stopping charging or discharging of the battery pack 10, polarization resulting from charging or discharging until time t12 decreases toward an eliminated state.

At time t13, external charging is started. In the example shown in FIG. 5, external charging is started at an electric power Win_low lower than the predetermined electric power Win_fix. External charging may also be started at an electric power higher than the predetermined electric power Win_fix. The SOC of the battery pack 10 at the start of external charging changes in response to the traveling state of the vehicle.

In a period from time t13 to time t14, external charging at the electric power Win_low is carried out. At time t14, electric power during external charging changes from the electric power Win_low to the predetermined electric power Win_fix. From time t14, external charging is carried out at the predetermined electric power Win_fix. At time t14, the process shown in FIG. 4 is started. When external charging at the predetermined electric power Win_fix is started at time t13, the process shown in FIG. 4 is started at time t13.

At time t15, external charging is temporarily stopped. A period from time t14 to time t15 is the predetermined time tm_th described in the process of step S102 shown in FIG. 4. At time t15, the first stop voltage value Vb_m1 is detected, and the SOC_m1 and the rate of change in electromotive voltage CR1 are calculated. After the SOC_m1 and the rate of change in electromotive voltage CR1 are calculated, external charging at the predetermined electric power Win_fix is resumed at time t16.

The electric power Win_fix at the time when external charging is carried out from time t16 is equal to the electric power Win_fix at the time when external charging is carried out in a period from time t14 to time t15. A period from time t15 to time t16 may be set as needed. That is, in the period from time t15 to time t16, the first stop voltage value Vb_m1 just needs to be detected, and the SOC_m1 and the rate of change in electromotive voltage CR1 just need to be able to be calculated.

From time t16, the accumulated current value $\Sigma$Ib is calculated. At time t17, external charging is temporarily stopped. The accumulated current value $\Sigma$Ib in a period from time t16 to time t17 is used to calculate the full charge capacity FCC. At time t17, the second stop voltage value Vb_m2 is detected, and the SOC_m2 and the rate of change in electromotive voltage CR2 are calculated. After the SOC_m2 and the rate of change in electromotive voltage CR2 are calculated, external charging is resumed at time t18. A period from time t17 to time t18 may be set as needed. That is, in the period from time t17 to time t18, the second stop voltage value Vb_m2 just needs to be detected, and the SOC_m2 and the rate of change in electromotive voltage CR2 just need to be able to be calculated.

External charging is carried out from time t18 to time t19. In the example shown in FIG. 5, an electric power in external charging in a period from time t18 to time t19 is lower than the predetermined electric power Win_fix. An electric power in external charging in the period from time t18 to time t19 may be higher than the predetermined electric power Win_fix. At time t19, external charging completes. When the difference (absolute value) ΔCR between the rates of change in electromotive voltage CR1, CR2 is smaller than or equal to the allowable value ΔCR_th, the full charge capacity FCC is calculated on the basis of the SOC_m1, the SOC_m2 and the accumulated current value ΣIb.

FIG. 6 shows the behavior (one example) of the SOC of the battery pack 10, and is a graph corresponding to FIG. 5. In the example shown in FIG. 6, when external charging is completed, the second stop voltage value Vb_m2 is detected, and the SOC_m2 and the rate of change in electromotive voltage CR2 are calculated.

In FIG. 6, between time t21 and time t22, the vehicle travels, and the battery pack 10 is charged or discharged in response to the traveling state of the vehicle. Between time t22 and time t23, the vehicle is left standing, and charging or discharging of the battery pack 10 is stopped. At time t23, external charging at the predetermined electric power Win_fix is started. Accordingly, measurement of the elapsed time tm is started. The SOC of the battery pack 10 at the start of external charging changes in response to the traveling state of the vehicle.

Depending on a period from time t22 to time t23, polarization is eliminated or polarization remains at time t23. After external charging is started, external charging is temporarily stopped at time t24. A period from time t23 to time t24 is the predetermined time tm_th described in the process of step S102 shown in FIG. 4.

At time t24, the first stop voltage value Vb_m1 is detected, and the SOC_m1 and the rate of change in electromotive voltage CR1 are calculated. After the SOC_m1 and the rate of change in electromotive voltage CR1 are calculated, external charging at the predetermined electric power Win_fix is resumed at time t25. The electric power Win_fix at the time when external charging is carried out from time t25 is equal to the electric power Win_fix at the time when external charging is carried out in the period from time t23 to time t24. A period from time t24 to time t25 may be set as needed. That is, in the period from time t24 to time t25, the first stop voltage value Vb_m1 just needs to be detected, and the SOC_m1 and the rate of change in electromotive voltage CR1 just need to be able to be calculated.

From time t25, the accumulated current value ΣIb is calculated. At time t26, external charging completes. The accumulated current value ΣIb in a period from time t25 to time t26 is used to calculate the full charge capacity FCC. From time t26, the second stop voltage value Vb_m2 is detected, and the SOC_m2 and the rate of change in electromotive voltage CR2 are calculated. When the difference (absolute value) ΔCR between the rates of change in electromotive voltage CR1, CR2 is smaller than or equal to the allowable value ΔCR_th, the full charge capacity FCC is calculated on the basis of the SOC_m1, the SOC_m2 and the accumulated current value ΣIb.

When polarization of the battery pack 10 is eliminated before external charging is started and after external charging is completed, the OCVs (OCV_s, OCV_e shown in FIG. 2) of the battery pack 10 may be acquired. In this case, the SOCs are calculated from the corresponding OCVs, and the full charge capacity FCC may be calculated on the basis of the above-described mathematical expression (1). In the present embodiment, in addition to calculation of the full charge capacity FCC in this way, the full charge capacity FCC may be calculated on the basis of the process shown in FIG. 4. Thus, it is possible to increase an opportunity to calculate the full charge capacity FCC.

In the present embodiment, even when polarization of the battery pack 10 is not eliminated at the start of external charging, the full charge capacity FCC can be calculated by executing the process shown in FIG. 4. Even when polarization of the battery pack 10 is not eliminated at the completion of external charging, the full charge capacity FCC can be calculated.

A second embodiment of the invention will be described. Like reference numerals denote the same components to those described in the first embodiment, and the detailed description thereof is omitted. Hereinafter, the difference from the first embodiment will be mainly described.

In the first embodiment, in the process of step S102 shown in FIG. 4, the elapsed time tm is compared with the predetermined time (fixed value) tm_th. In the present embodiment, the predetermined time tm_th is set on the basis of the battery temperature Tb during external charging or the charge power during external charging. That is, the predetermined time tm_th is changed with the battery temperature Tb or the charge power. When the predetermined time tm_th is set, at least one of the battery temperature Tb or the charge power just needs to be considered.

For example, as the battery temperature Tb decreases, a time required until a convergence of the voltage variation ΔV_dyn resulting from polarization during external charging extends or the converged voltage variation ΔV_dyn increases. In other words, as the battery temperature Tb increases, a time required until a convergence of the voltage variation ΔV_dyn resulting from polarization during external charging shortens or the converged voltage variation ΔV_dyn decreases.

Figure 7:
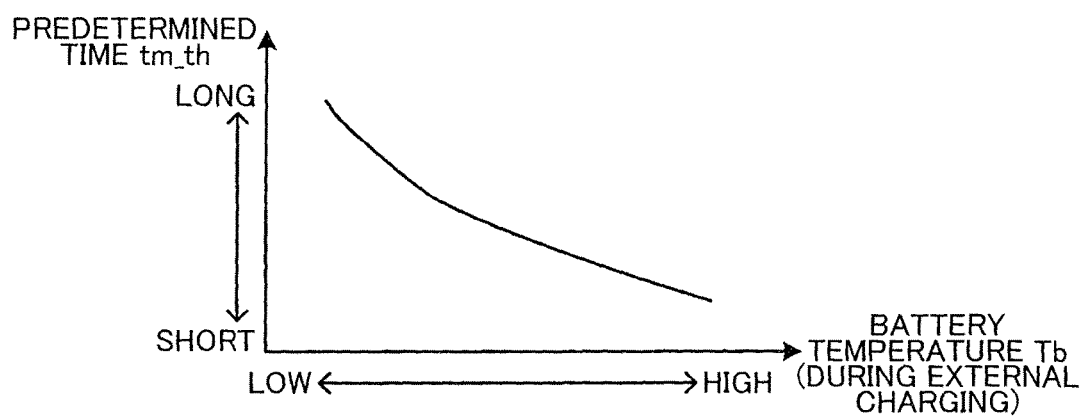
FIG. 7 is a graph that shows the correlation between a battery temperature during external charging and a predetermined time.

Therefore, when the battery temperature Tb is considered, it is possible to change the timing at which it may be determined that the voltage variation ΔV_dyn resulting from polarization during external charging has converged. That is, in a proper period, it may be determined that the voltage variation ΔV_dyn has converged. In the present embodiment, the predetermined time tm_th is changed on the basis of the battery temperature Tb. For example, when a time required until a convergence of the voltage variation ΔV_dyn extends as the battery temperature Tb decreases, the predetermined time tm_th may be extended as the battery temperature Tb decreases as shown in FIG. 7. In other words, the predetermined time tm_th may be shortened as the battery temperature Tb increases.

When the correlation (relationship shown in FIG. 7) between a battery temperature Tb and a predetermined time tm_th is obtained in advance by an experiment, or the like, the predetermined time tm_th corresponding to the battery temperature Tb may be calculated by detecting the battery temperature Tb. The correlation between a battery temperature Tb and a predetermined time tm_th may be expressed as a map or a function, and information that identifies the correlation may be stored in the memory 31.

On the other hand, for example, as the charge power during external charging increases, a time required until a convergence of the voltage variation ΔV_dyn resulting from polarization during external charging extends or the converged voltage variation ΔV_dyn increases. In other words, as the charge power decreases, a time required until a convergence of the voltage variation ΔV_dyn resulting from polarization during external charging shortens or the converged voltage variation ΔV_dyn decreases.

Figure 8:
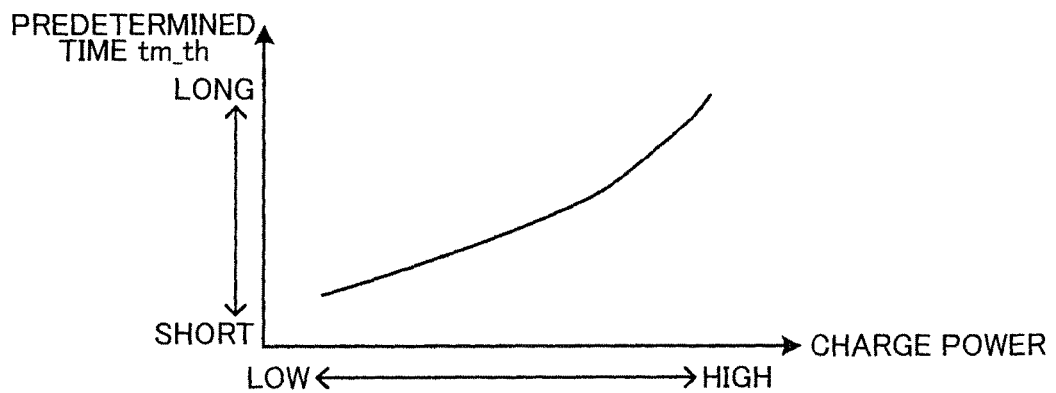
FIG. 8 is a graph that shows the correlation between a charge power and a predetermined time.

Therefore, when the charge power during external charging is considered, it is possible to change the timing at which it may be determined that the voltage variation $\Delta V\_dyn$ resulting from polarization during external charging has converged. That is, in a proper period, it may be determined that the voltage variation $\Delta V\_dyn$ has converged. In the present embodiment, the predetermined time $tm\_th$ is changed on the basis of the charge power. For example, when a time required until a convergence of the voltage variation $\Delta V\_dyn$ extends as the charge power increases, the predetermined time $tm\_th$ may be extended as the charge power increases as shown in FIG. 8. In other words, the predetermined time $tm\_th$ may be shortened as the charge power decreases.

When the correlation (relationship shown in FIG. 8) between a charge power and a predetermined time $tm\_th$ is obtained in advance by an experiment, or the like, the predetermined time $tm\_th$ corresponding to the charge power may be calculated by acquiring the charge power. The correlation between a charge power and a predetermined time $tm\_th$ may be expressed as a map or a function, and information that identifies the correlation may be stored in the memory 31.

In carrying out external charging, when the charge power is determined in advance, the predetermined time $tm\_th$ corresponding to the charge power just needs to be set. In carrying out external charging, when the charge power may be changed, the predetermined time $tm\_th$ just needs to be set after acquiring the charge power as described above. When the predetermined time $tm\_th$ is set on the basis of the charge power and the battery temperature Tb, the correlation among a charge power, a battery temperature Tb and a predetermined time $tm\_th$ may be obtained in advance.

Figure 9A:
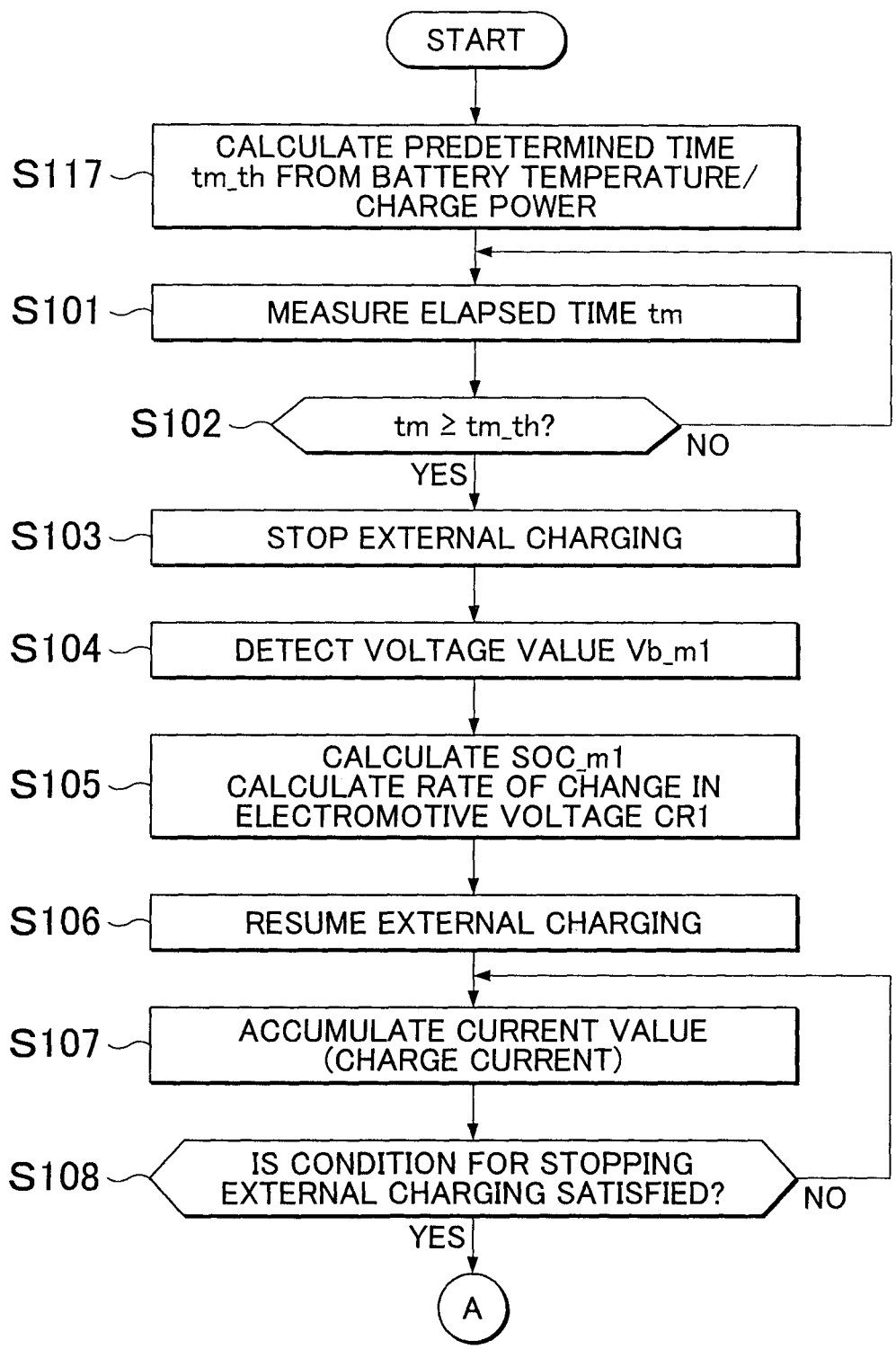
FIG. 9 is a flowchart that illustrates the process of calculating the full charge capacity of the battery pack according to a second embodiment.
Figure 9B:
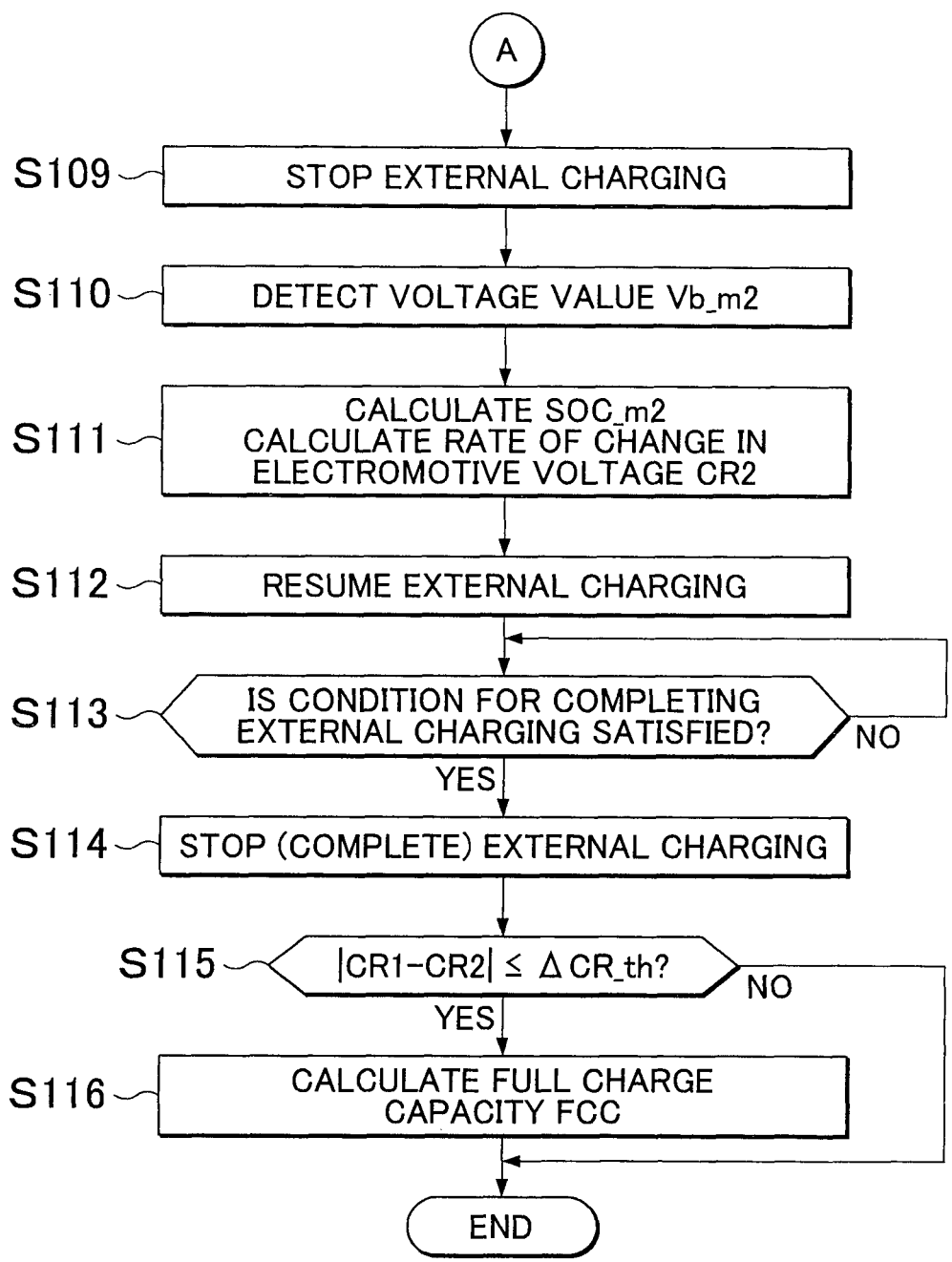

FIG. 9 is a flowchart that shows the process of calculating the full charge capacity FCC of the battery pack 10 according to the present embodiment. The process shown in FIG. 9 corresponds to the process shown in FIG. 4. In FIG. 9, like step numbers denote the same processes as the processes shown in FIG. 4, and the detailed description thereof is omitted.

In the present embodiment, the process of step S117 is executed before the process of step S101 is executed. In step S117, the controller 30 calculates the predetermined time $tm\_th$ on the basis of the battery temperature Tb and the charge power as described above. The battery temperature Tb is detected by the temperature sensor 23. The battery temperature Tb at the time when external charging at the predetermined electric power Win_fix is started may be used as the battery temperature Tb. The charge power may be calculated from the output voltage of the charger 26 and the current value Ib during external charging. The output voltage of the charger 26 may be detected by a voltage sensor (not shown). The current value Ib during external charging is detected by the current sensor 22.

After the process of step S117 is executed, the processes from step S101 are executed. In the process of step S102, the elapsed time tm is compared with the predetermined time $tm\_th$ calculated in the process of step S117. As in the case of the first embodiment (the process shown in FIG. 4), the full charge capacity FCC of the battery pack 10 may be calculated.

In the present embodiment, the predetermined time $tm\_th$ that is set on the basis of at least one of the battery temperature Tb or the charge power can be shorter than the predetermined time (fixed value) $tm\_th$ described in the first embodiment. As described in the first embodiment, the predetermined time (fixed value) $tm\_th$ is set to the longest time required until a convergence of the voltage variation $\Delta V\_dyn$. In this case, the predetermined time $tm\_th$ that is set on the basis of at least one of the battery temperature Tb or the charge power tends to be shorter than the predetermined time (fixed value) $tm\_th$.

When the predetermined time $tm\_th$ may be shortened, a period from time t14 to time t15 shown in FIG. 5 or a period from time t23 to time t24 shown in FIG. 6 may be shortened. In FIG. 5, when the period from time t14 to time t15 is shortened, a period from time t16 to time t17 may be extended. In FIG. 6, when the period from time t23 to time t24 is shortened, a period from time t25 to time t26 may be extended. Thus, it is possible to increase the accumulated current value $\Sigma Ib$ or increase the variation $\Delta SOC$ between the SOC_m1 and the SOC_m2.

As described in the first embodiment, in terms of improving the estimation accuracy of, the full charge capacity FCC, it is preferable to increase the accumulated current value $\Sigma Ib$ or the variation $\Delta SOC$. According to the present embodiment, as described above, it is possible to increase the accumulated current value $\Sigma Ib$ or the variation $\Delta SOC$, so it is possible to improve the estimation accuracy of the full charge capacity FCC.

A third embodiment of the invention will be described. Like reference numerals denote the same components to those described in the first embodiment, and the detailed description thereof is omitted. Hereinafter, the difference from the first and second embodiments will be mainly described.

In the first and second embodiments, when external charging is started, the predetermined time $tm\_th$ is calculated on the assumption that polarization of the battery pack 10 is eliminated. In starting external charging, there is already polarization. Specifically, in a period from when charging or discharging of the battery pack 10 is stopped to when external charging is started, there is a possibility that polarization resulting from charging or discharging of the battery pack 10 is not eliminated.

In this case, a convergence of the voltage variation $\Delta V\_dyn$ resulting from polarization during external charging depends on the state of polarization at the start of external charging. That is, when polarization resulting from discharging is not eliminated at the start of external charging, a time required until a convergence of the voltage variation $\Delta V\_dyn$ resulting from polarization during external charging tends to extend.

When the vehicle travels, the battery pack 10 is discharged. Therefore, after traveling of the vehicle is stopped, there is polarization resulting from discharging of the battery pack 10. When external charging is carried out while polarization resulting from discharging remains, polarization resulting from external charging occurs after the polarization resulting from discharging is eliminated, and the voltage variation $\Delta V\_dyn$ resulting from the polarization converges. The state of polarization changes in this way, so, as compared to when polarization resulting from discharging is eliminated, a time required until a convergence of the voltage variation $\Delta V\_dyn$ resulting from polarization during external charging tends to extend.

Therefore, in the present embodiment, the predetermined time $tm\_th$ is set in consideration of not only the state of polarization after the start of external charging but also the state of polarization before the start of external charging. The state of polarization before the start of external charging depends on a time during which charging or discharging of the battery pack 10 is stopped (referred to as standing time) or a battery temperature Tb in a period during which charging or discharging is stopped (referred to as battery temperature Tb during standing). Specifically, as the standing time extends, polarization becomes more likely to be eliminated. In other words, as the standing time shortens, polarization becomes less likely to be eliminated. As the battery temperature Tb during standing increases, polarization is more likely to be eliminated. In other words, as the battery temperature Tb during standing decreases, polarization is less likely to be eliminated.

Figure 10:
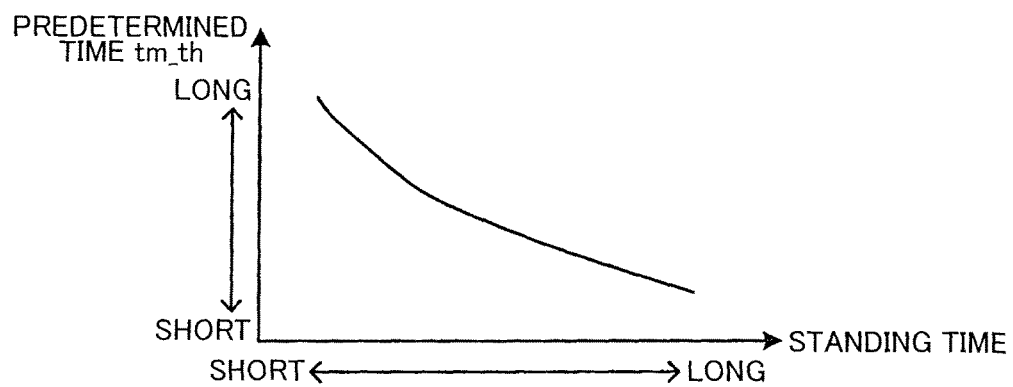
FIG. 10 is a graph that shows the correlation between a standing time and a predetermined time.

When the predetermined time tm_th is set in consideration of the standing time of the battery pack 10, the correlation between a standing time and a predetermined time tm_th just needs to be determined in advance. Specifically, as shown in FIG. 10, as the standing time extends, the predetermined time tm_th may be shortened. In other words, as the standing time shortens, the predetermined time tm_th may be extended. Thus, by measuring the standing time, the predetermined time tm_th corresponding to the standing time may be calculated.

Figure 11:
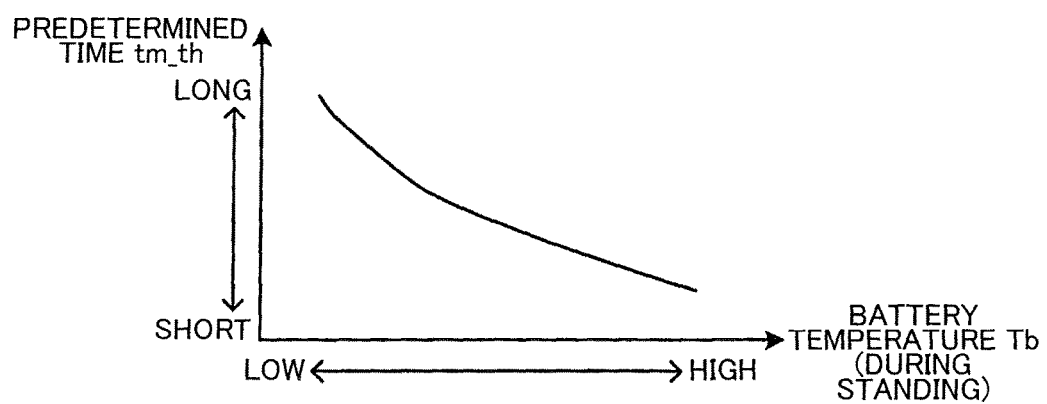
FIG. 11 is a graph that shows the correlation between a battery temperature during standing and a predetermined time.

On the other hand, when the predetermined time tm_th is set in consideration of the battery temperature Tb during standing, the correlation between a battery temperature Tb during standing and a predetermined time tm_th just needs to be determined in advance. Specifically, as shown in FIG. 11, as the battery temperature Tb during standing increases, the predetermined time tm_th may be shortened. In other words, as the battery temperature Tb during standing decreases, the predetermined time tm_th may be extended. Thus, when the battery temperature Tb during standing is configured to be detected, the predetermined time tm_th corresponding to the battery temperature Tb may, be calculated.

When the predetermined time tm_th is set in consideration of the standing time and the battery temperature Tb during standing, the correlation among a standing time, a battery temperature Tb during standing and a predetermined time tm_th just needs to be obtained in advance. When the predetermined time tm_th is determined, a time required until polarization that has occurred before the start of external charging (polarization resulting from discharging) is eliminated and a time required until a convergence of the voltage variation ΔV_dyn, resulting from polarization during external charging may be considered.

Figure 12:
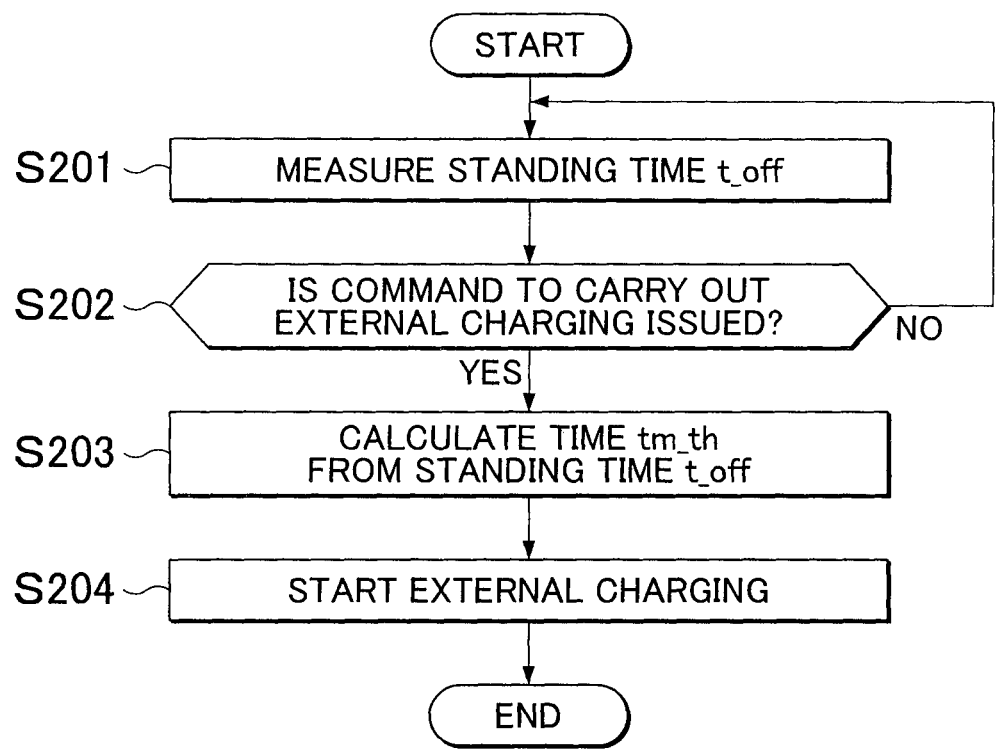
FIG. 12 is a flowchart that illustrates the process of calculating the predetermined time according to a third embodiment.

FIG. 12 is a flowchart that shows a process in which the predetermined time tm_th is calculated and then external charging is started. The process shown in FIG. 12 is started when the ignition switch switches from the on state to the off state. The process shown in FIG. 12 is executed by the controller 30. After the process shown in FIG. 12 is executed, the process shown in FIG. 4 is executed. As in the case of the present embodiment, when the predetermined time tm_th is set in consideration of the state of polarization before the start of external charging, measurement of the elapsed time tm is started in response to the start of external charging. As described in the first embodiment, the electric power at the start of, external charging is the predetermined electric power Win_fix.

In step S201, the controller 30 measures a standing time t_off with the use of the timer 32. The standing time t_off is an elapsed time from when the ignition switch switches from the on state to the off state.

In step S202, the controller 30 determines whether a command to carry out external charging is issued. That is, the controller 30 continues measuring the standing time t_off until a command to carry out external charging is issued. When the plug 28 is connected to the inlet 27, a command to carry out external charging can be input to the controller 30. Thus, the controller 30 is able to determine that a command to carry out external charging is issued.

On the other hand, when the plug 28 is connected to the inlet 27, time at which external charging is started (referred to as charging start time) can be set by a user. In this case, when the current time becomes the charging start time, the controller 30 determines that a command to carry out external charging is issued. Not the charging start time but scheduled time for starting up the vehicle (referred to start-up time) can be set by the user. At this time, the charging start time is set so that external charging completes before the start-up time.

When a command to carry out external charging is issued, the controller 30 calculates the predetermined time tm_th on the basis of the standing time t_off in step S203 as described above. The standing time t_off at the time when the predetermined time tm_th is calculated is a time from when the ignition switch switches from the on state to the off state to when a command to carry out external charging is issued.

In step S204, the controller 30 starts external charging. Specifically, the controller 30 carries out external charging by switching the charging relays CHR-B, CHR-G into the on state to operate the charger 26. After the process of external charging is started, that is, after the process shown in FIG. 12 is ended, the process shown in FIG. 4 is executed. In the process of step S102 shown in FIG. 4, the predetermined time tm_th calculated in the process of step S203 shown in FIG. 12 is used.

In the process shown in FIG. 12, the predetermined time tm_th is calculated on the basis of only the standing time t_off; however, calculation of the predetermined time tm_th is not limited to this configuration. As described above, the predetermined time tm_th may be calculated on the basis of at least one of the battery temperature Tb during standing or the standing time t_off. When the battery temperature Tb changes with a temperature around the battery pack 10 (environment temperature) while charging or discharging of the battery pack 10 is stopped, the average of the battery temperature Tb while charging or discharging is stopped may be, for example, calculated. The average (battery temperature Tb) may be set as the battery temperature Tb during standing.

In the present embodiment, the predetermined time tm_th is calculated on the basis of at least one of the standing time t_off or the battery temperature Tb during standing; however, calculation of the predetermined time tm_th is not limited to this configuration. Specifically, when the predetermined time tm_th is calculated, the battery temperature Tb or charge power during external charging, described in the second embodiment, may be considered. That is, the predetermined time tm_th may be calculated-on the basis of at least one of the standing time t_off, the battery temperature Tb (the battery temperature Tb during external charging or during standing), or the charge power during external charging. In this case, the correlation between at least one of a standing time t_off, a battery temperature Tb (a battery temperature Tb during external charging or during standing), or a charge power and a predetermined time tm_th just needs to be obtained in advance.

According to the present embodiment, by setting the predetermined time tm_th in consideration of the state of polarization before the start of external charging, it may be determined whether the voltage variation ΔV_dyn resulting from polarization during external charging has converged in a situation that there is polarization before the start of external charging. As described above, because the predetermined time tm_th is changed in accordance with the standing time t_off, or the like, it is possible to suppress, an undue extension of a time required until it is determined that the voltage variation ΔV_dyn has converged. As described in the second embodiment, as the predetermined time tm_th is shortened, the accumulated current value ΣIb or the variation ΔSOC may be increased, so it is possible to improve the estimation accuracy of the full charge capacity FCC.

A fourth embodiment of the invention will be described. Like reference numerals denote the same components to those described in the first embodiment, and the detailed description thereof is omitted. Hereinafter, the difference from the first embodiment will be mainly described.

In the first embodiment (the process shown in FIG. 4), external charging is temporarily stopped, and the first stop voltage value Vb_m1 or the second stop voltage value Vb_m2 is detected. When external charging is carried out, external charging can be temporarily stopped in order to acquire an offset value of the current sensor 22. Specifically, each time a predetermined time elapses, external charging is stopped in order to acquire the offset value of the current sensor 22.

In this case, external charging is stopped when the offset value of the current sensor 22 is acquired, so the first stop voltage value Vb_m1 or the second stop voltage value Vb_m2 may be detected during the stop of external charging. In the present embodiment, when external charging is stopped in order to acquire the offset value of the current sensor 22, the first stop voltage value Vb_m1 or the second stop voltage value Vb_m2 is detected. Thus, in accordance with the timing at which the offset value is acquired, the first stop voltage value Vb_m1 or the second stop voltage value Vb_m2 may be detected.

When external charging is stopped, no current flows through the battery pack 10. The current value Ib detected by the current sensor 22 at this time is the offset value. The offset value, of the current sensor 22 is used in order to correct the current value Ib detected by the current sensor 22. By correcting the current value Ib on the basis of the offset value, it is possible to improve the accuracy of calculating the accumulated current value ΣIb. When the calculation accuracy of the accumulated current value ΣIb is improved, it is possible to improve the estimation accuracy of the full charge capacity FCC at the time when the full, charge capacity FCC is calculated (estimated) on the basis of the above-described mathematical expression (1).

Figure 13A:
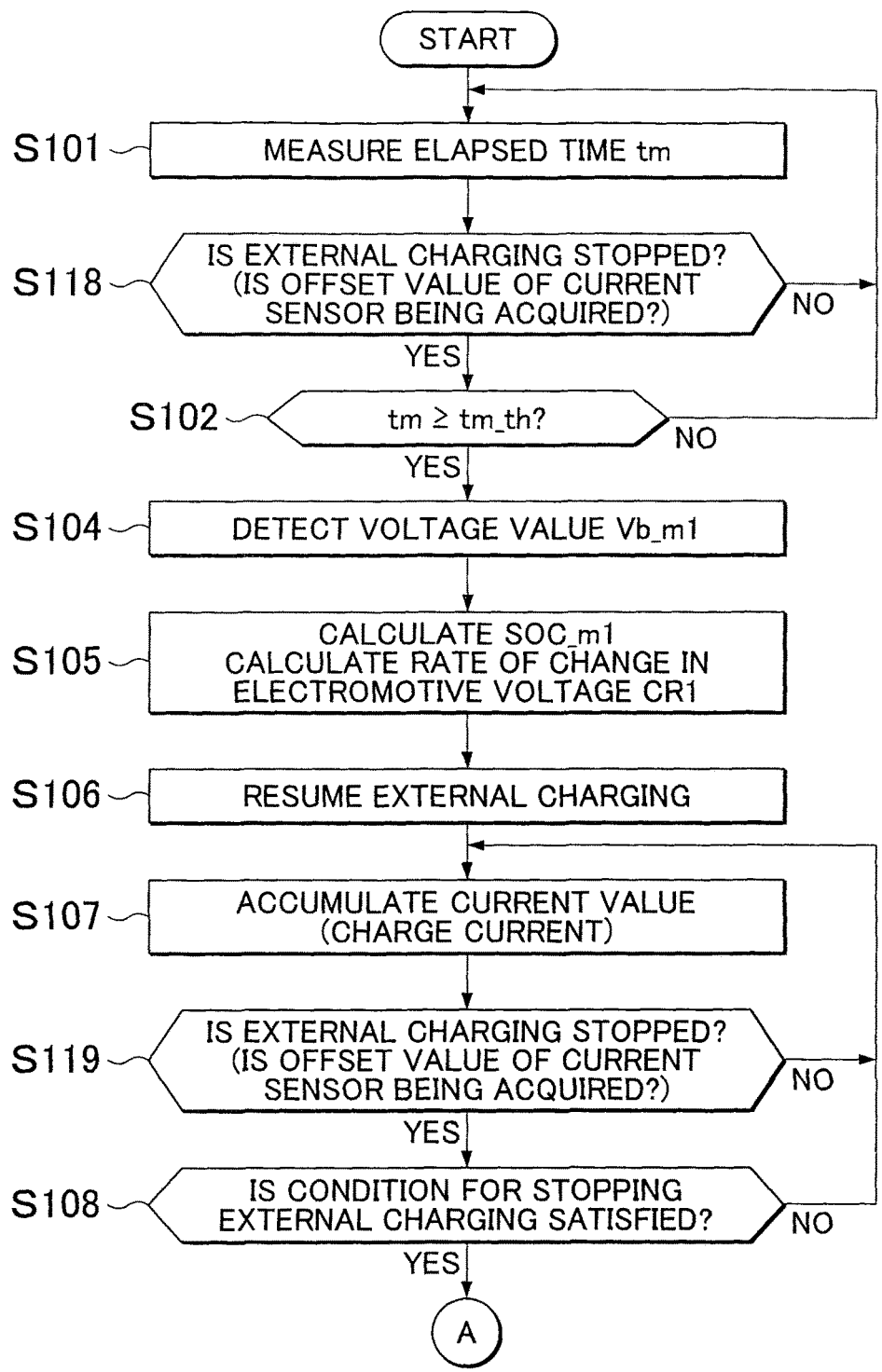
FIG. 13 is a flowchart that illustrates the process of calculating the full charge capacity of the battery pack according to a fourth embodiment.
Figure 13B:
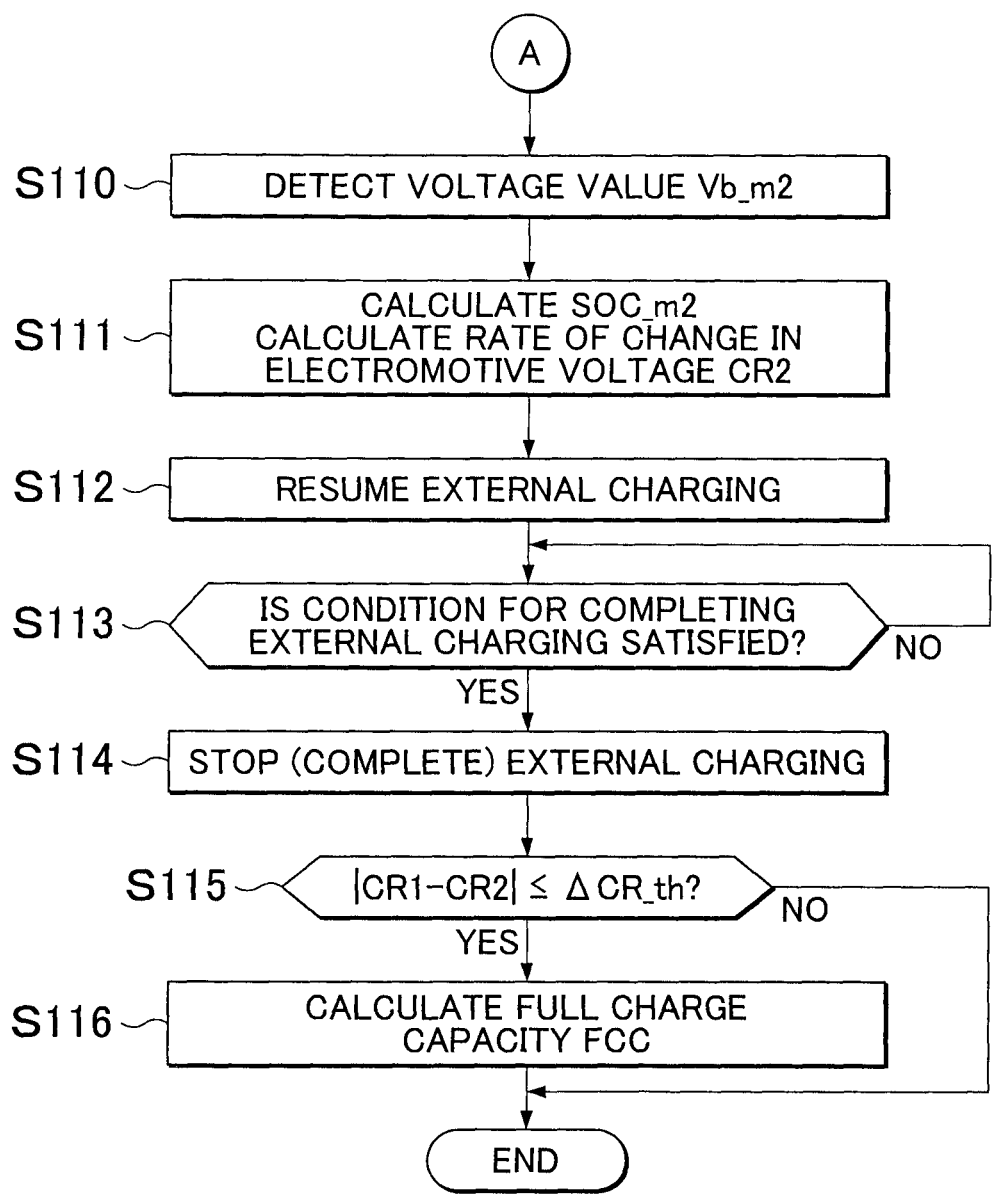

FIG. 13 is a flowchart that shows the process of calculating the full charge capacity. FCC of the battery pack 10 according to the present embodiment. The process shown in FIG. 13 corresponds to the process shown in FIG. 4. In FIG. 13, like step numbers denote the same processes as the processes shown in FIG. 4, and the detailed description thereof is omitted.

Separately from the process shown in FIG. 13, control for acquiring the offset value of the current sensor 22 is executed. Specifically, after the start of external charging, external charging is temporarily stopped each time the predetermined time elapses, and the offset value of the current sensor 22 is acquired at the time when external charging is stopped: After the offset value is acquired, external charging is resumed.

After the process of step S101 is executed, the controller 30 determines in step S118 whether external charging is stopped in order to acquire the offset value of the current sensor 22. When external charging is not stopped, measurement of the elapsed time tm is continued in the process of step S101. When external charging is stopped, the controller 30 executes the process of step S102.

In the process of step S102, when the elapsed time tm is shorter than the predetermined time tm_th, the controller 30 continues measurement of the elapsed time tm in the process of step S101. When the elapsed time tm is longer than or equal to the predetermined time tm_th, the controller 30 detects the first stop voltage value. Vb_m1 in the process of step S104. External charging is resumed after the offset value of the current sensor 22 is acquired. In the process shown in FIG. 13, after the processes of step S104 and step S105 are executed, external charging is resumed through the process of step S106.

On the other hand, after the accumulated current value ΣIb is calculated through the process of step S107, the controller 30 determines in step S119 whether external charging is stopped in order to acquire the offset value of the current sensor 22. When external charging is not stopped, calculation of the accumulated current value ΣIb is continued in the process of step S107. When external charging is stopped, the controller 30 determines in step S108 whether the condition for stopping external charging is satisfied.

When the condition for stopping external charging is satisfied, the controller 30 executes the processes from step S110. On the other hand, when the condition for stopping external charging is not satisfied, calculation of the accumulated current value ΣIb is continued in the process of step S107. External charging is resumed after the offset value of the current sensor 22 is acquired. In the process shown in FIG. 13, after the processes of step S110 and step S111 are executed, external charging is resumed through the process of step S112. As described in the first embodiment, when the second stop voltage value Vb_m2 is detected after the completion of external charging, the process of step S119 is omitted.

In the process shown in FIG. 13, the predetermined time tm_th is not limited to the predetermined time (fixed value) tm_th described in the first embodiment. That is, each of the predetermined times tm_th respectively described in the second and third embodiments may be used as the predetermined time tm_th that is used in the process of step S102 shown in FIG. 13.

The invention claimed is:

1. An electrical storage system comprising:
an electrical storage device configured to be charged with electric power from an external power supply;
a voltage sensor configured to detect a voltage value of the electrical storage device;
a current sensor configured to detect a current value of the electrical storage device; and
a controller configured to
control the voltage sensor to detect a first voltage value when charging of the electrical storage device is temporarily stopped immediately after a duration of the charging at a predetermined electric power is longer than or equal to a predetermined time, the predetermined time being a time required for a convergence of a voltage variation resulting from polarization during the charging,
calculate a first state of charge (SoC) based on a first correlation between the first voltage value of the electrical storage device and an SoC of the electrical storage device,
control the voltage sensor to detect a second voltage value when the charging is stopped again after the temporarily stopped charging is resumed at the predetermined electric power, calculate a second SoC based on a second correlation between the second voltage value and the SoC of the electrical storage device, and calculate a full charge capacity based on an accumulated value of the current value in a period from a first point in time when the charging is resumed to a second point in time when the charging is stopped, and a variation between the first SoC and the second SoC, wherein, when a difference between a rate of change of the first voltage value and a rate of change of the second voltage value is smaller than or equal to an allowable value, the rate of change of the first voltage value and the rate of the change of the second voltage value are identified from the first correlation and the second correlation, respectively, and indicate a ratio of a variation in an open circuit voltage of the electrical storage device to a variation in the SoC.

2. The electrical storage system according to claim 1, wherein the controller is further configured to shorten the predetermined time as the predetermined electric power decreases.

3. The electrical storage system according to claim 1, wherein the controller is further configured to shorten the predetermined time as a time during which charging or discharging of the electrical storage device is stopped extends, when the charging at the predetermined electric power is started in a state where charging or discharging of the electrical storage device is stopped.

4. The electrical storage system according to claim 1, further comprising:

a temperature sensor configured to detect a temperature of the electrical storage device, wherein the controller is further configured to shorten the predetermined time as the temperature at the time when the charging at the predetermined electric power is started increases.

5. The electrical storage system according to claim 1, further comprising:

a temperature sensor configured to detect a temperature of the electrical storage device, wherein the controller is further configured to shorten the predetermined time as the temperature at the time when charging or discharging of the electrical storage device is stopped increases, when the charging at the predetermined electric power is started from a state where charging or discharging of the electrical storage device is stopped.

6. The electrical storage system according to claim 1, wherein the controller is further configured to temporarily stop the charging when an offset value of the current sensor is acquired, and control the voltage sensor to detect the first voltage value in response to the duration of the charging at the predetermined electric power being longer than or equal to the predetermined time, when the charging is temporarily stopped.

7. The electrical storage system according to claim 1, wherein the controller is further configured to control the voltage sensor to detect the second voltage value, when the charging is completed or when the charging is temporarily stopped in order to acquire an offset value of the current sensor.

8. An electrical storage system for a vehicle, the electrical storage system comprising:

an electrical storage device configured to be charged with electric power from an external power supply, the external power supply being installed outside the electrical storage device separately from the electrical storage device; and a controller configured to perform a first charging to charge the electrical storage device for a predetermined time, the predetermined time being a time required for a convergence of a change in voltage of the electrical storage device due to polarization resulting from the charging, stop the first charging after the predetermined time, perform a second charging at a first point in time after the first charging is stopped, until a second point time when an accumulated amount of electrical power in the electrical storage device is greater than predetermined amount, and calculate a full charge capacity of the electrical storage device based on a variation in state of charge of the electrical storage device while the polarization exists, in a period from the first point in time when the second charging is resumed after the first charging is stopped, to the second point in time when the accumulated amount of the electrical power in the electrical storage device is greater than the predetermined amount.

9. An electrical storage system for a vehicle, the electrical storage system comprising:

an electrical storage device configured to be charged with electric power from an external power supply, the external power supply being installed outside the electrical storage device separately from the electrical storage device; and a controller configured to perform a calculation of a full charge capacity of the electrical storage device based on a state of charge of the electrical storage device while polarization resulting from charging of the electrical storage device exists, in a period from a first point in time when a second charging of the electrical storage device is started with a time gap from a first charging of the electrical storage device, to a second point in time when an accumulated amount of electrical power in the electrical storage device is greater than a predetermined amount, wherein the calculation of the full charge capacity of the electrical storage device is delayed until the second charging is started after a convergence of a change in voltage of the electrical storage device due to the polarization.

* * * * *